United States Patent
Choi et al.

(10) Patent No.: US 11,302,698 B2
(45) Date of Patent: Apr. 12, 2022

(54) METHODS OF FORMING A CAPACITOR, SEMICONDUCTOR DEVICE, AND FINE PATTERN, AND SEMICONDUCTOR DEVICE FORMED BY THE METHODS

(71) Applicant: Samsung Electronics Co., Ltd., Suwon-si (KR)

(72) Inventors: Yoonyoung Choi, Seoul (KR); Sungsoo Yim, Seoul (KR); Byeongmoo Kang, Busan (KR); Seongmo Koo, Seoul (KR); Sejin Park, Hwaseong-si (KR); Jinwoo Bae, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/829,025

(22) Filed: Mar. 25, 2020

(65) Prior Publication Data

US 2020/0312853 A1   Oct. 1, 2020

(30) Foreign Application Priority Data

Mar. 25, 2019  (KR) .................. 10-2019-0033739

(51) Int. Cl.
*H01L 27/108* (2006.01)
*H01L 49/02* (2006.01)

(52) U.S. Cl.
CPC .... *H01L 27/1085* (2013.01); *H01L 27/10805* (2013.01); *H01L 27/10873* (2013.01); *H01L 28/40* (2013.01)

(58) Field of Classification Search
None
See application file for complete search history.

(56) References Cited

U.S. PATENT DOCUMENTS

| 4,689,112 | A | * | 8/1987 | Bersin | H01J 37/32339 |
|---|---|---|---|---|---|
| | | | | | 156/345.35 |
| 6,156,636 | A | * | 12/2000 | Yeom | H01L 21/76897 |
| | | | | | 438/618 |
| 7,459,745 | B2 | | 12/2008 | Lee et al. | |
| 7,629,218 | B2 | | 12/2009 | Lee et al. | |

(Continued)

FOREIGN PATENT DOCUMENTS

| KR | 1020090045713 A | 5/2009 |
|---|---|---|
| KR | 1020090067606 A | 6/2009 |

(Continued)

*Primary Examiner* — Anthony Ho
*Assistant Examiner* — Kevin Quinto
(74) *Attorney, Agent, or Firm* — Muir Patent Law, PLLC

(57) ABSTRACT

A semiconductor device includes a transistor on a semiconductor substrate including a first area and a second area, and having a gate structure and an impurity area, a first interlayer insulating film covering the transistor, and having a contact plug electrically connected to the impurity area, a capacitor including a lower electrode on the first interlayer insulating film in the second area and electrically connected to the contact plug, a dielectric film coating a surface of the lower electrode, and an upper electrode on the dielectric film, and a support layer in contact with an upper side surface of the lower electrode to support the lower electrode, and extending to the first area, in which the support layer has a step between the first area and the second area.

19 Claims, 20 Drawing Sheets

(56) References Cited

U.S. PATENT DOCUMENTS

| | | |
|---|---|---|
| 7,727,837 B2 | 6/2010 | Schwerin et al. |
| 9,159,729 B2 | 10/2015 | Kim et al. |
| 9,177,960 B2 | 11/2015 | Seo |
| 9,263,536 B2 | 2/2016 | Kim et al. |
| 2009/0155977 A1* | 6/2009 | Han .................. H01L 21/28035 438/424 |
| 2009/0191708 A1* | 7/2009 | Kropewnicki .... H01L 21/76898 438/667 |
| 2012/0007165 A1* | 1/2012 | Lee .................... H01L 29/40114 257/316 |
| 2014/0154863 A1* | 6/2014 | Seo .................... H01L 27/10814 438/386 |
| 2015/0079757 A1 | 3/2015 | Jeon et al. |

FOREIGN PATENT DOCUMENTS

| | | |
|---|---|---|
| KR | 1020120004212 A | 1/2012 |
| KR | 1020130023809 A | 3/2013 |

\* cited by examiner

METHODS OF FORMING A CAPACITOR, SEMICONDUCTOR DEVICE, AND FINE PATTERN, AND SEMICONDUCTOR DEVICE FORMED BY THE METHODS

CROSS-REFERENCE TO RELATED APPLICATION

This application claims the benefit of priority under 35 U.S.C. § 119 to Korean Patent Application No. 10-2019-0033739, filed on Mar. 25, 2019, in the Korean Intellectual Property Office, the disclosure of which is incorporated herein in its entirety by reference.

BACKGROUND

The inventive concept relates to a method of forming a capacitor, a method of forming a semiconductor device, a method of forming a fine pattern, and a semiconductor device, and more particularly, to a method of forming a capacitor exhibiting superior performance, a method of forming a semiconductor device, a method of forming a fine pattern, and a semiconductor device.

To obtain superior performance of a memory device, improvement of the performance of a data storing device is needed. In particular, for DRAM that stores data in a capacitor, the performance of a capacitor affects the performance of a memory device.

SUMMARY

The inventive concept provides a method of forming a capacitor exhibiting superior performance.

The inventive concept provides a method of forming a semiconductor device exhibiting superior performance.

The inventive concept provides a method of forming a fine pattern.

The inventive concept provides a semiconductor device exhibiting superior performance.

According to an aspect of the inventive concept, there is provided a method of forming a capacitor, which includes forming a mold layer and a support material layer on a semiconductor substrate including a first area and a second area, forming a mask pattern for patterning the mold layer and the support material layer in the second area, forming a recess pattern exposing an upper surface of the semiconductor substrate by using the mask pattern, forming a protection film for lining a surface of the mask pattern and an inner surface of the recess pattern, removing a portion of the protection film to expose at least an upper surface of the mask pattern, removing the mask pattern by a dry cleaning method, removing a remaining portion of the protection film, forming a lower electrode in the recess pattern, removing the mold layer, forming a dielectric film on a surface of the lower electrode, and forming an upper electrode on the dielectric film.

According to another aspect of the inventive concept, there may be provided a method of forming a semiconductor device, which includes forming a transistor in a second area of a semiconductor substrate including a first area and the second area, the transistor including a gate structure and an impurity area, forming, on the semiconductor substrate, an interlayer insulating film covering the transistor and having a contact plug electrically connected to the impurity area, forming a mold layer and a support material layer on the interlayer insulating film, forming a mask pattern for patterning the mold layer and the support material layer in the second area, forming a recess pattern for exposing an upper surface of the semiconductor substrate by using the mask pattern, forming a protection film for lining an inner surface of the recess pattern, removing the mask pattern by a dry cleaning method after the forming of the protection film, removing the protection film after the removing of the mask pattern, forming a lower electrode in the recess pattern, selectively removing the mold layer, forming a dielectric film on a surface of the lower electrode, and forming an upper electrode on the dielectric film.

According to another aspect of the inventive concept, there may be provided a method of forming a fine pattern, which includes sequentially forming a first material film and a second material film on a semiconductor substrate including a first area and a second area, forming a mask pattern having a first pattern density in the first area and a second pattern density in the second area, wherein the second pattern density may be greater than the first pattern density, forming a recess pattern by using the mask pattern, wherein the recess pattern exposes an upper surface of the semiconductor substrate, forming a protection film for lining an inner surface of the recess pattern, removing the mask pattern by a dry cleaning method after the forming of the protection film, removing the protection film after the removing of the mask pattern, and forming a conductor in the recess pattern.

According to another aspect of the inventive concept, there may be provided a semiconductor device, which includes a transistor on a semiconductor substrate, the transistor having a gate structure and an impurity area, and the semiconductor substrate including a first area and a second area, a first interlayer insulating film covering the transistor, and having a contact plug electrically connected to the impurity area, a capacitor including a lower electrode on the first interlayer insulating film in the second area and electrically connected to the contact plug, a dielectric film coating a surface of the lower electrode, and an upper electrode on the dielectric film, and a support layer in contact with an upper side surface of the lower electrode to support the lower electrode, and extending to the first area, in which the support layer has a step between the first area and the second area.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
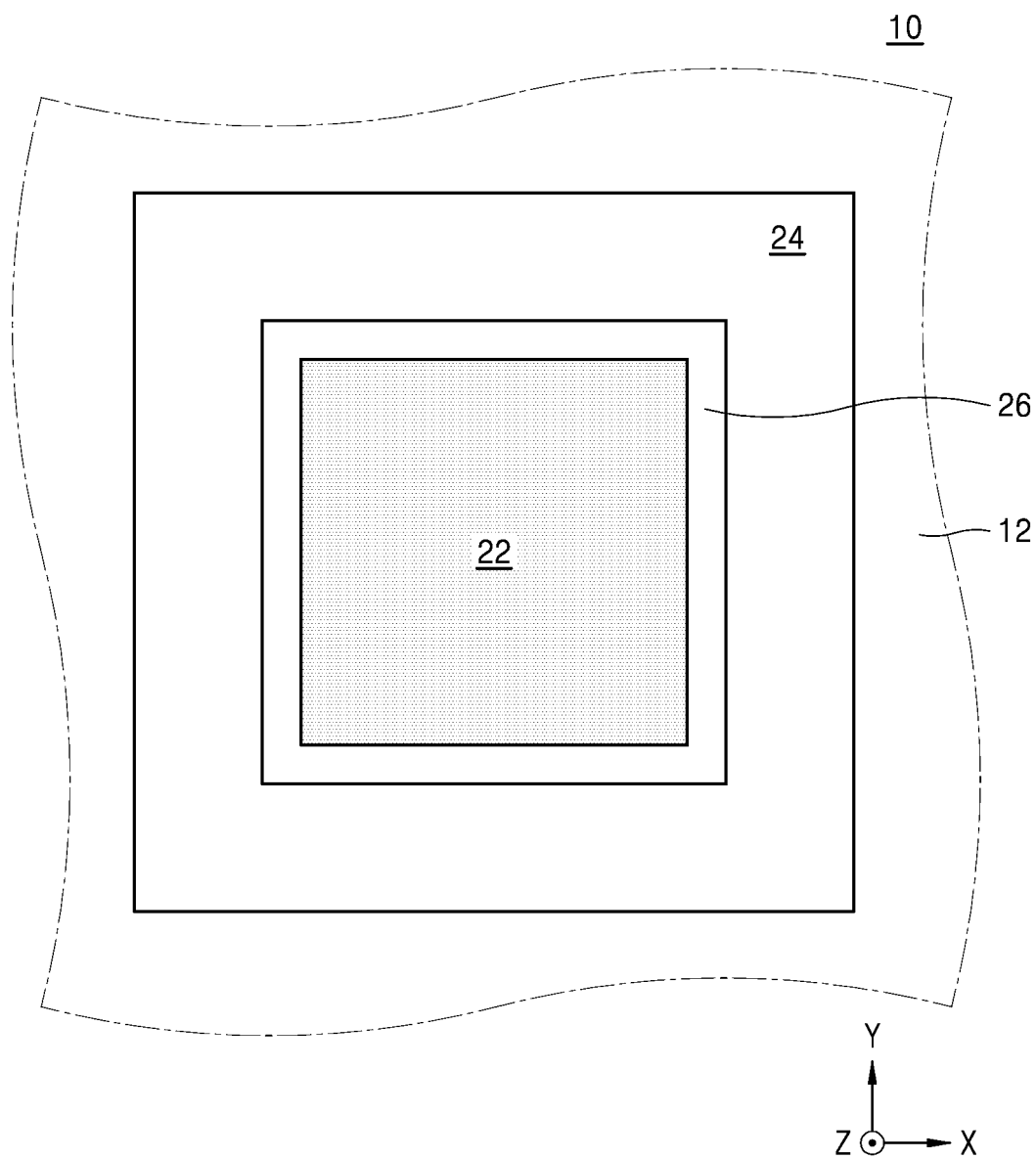
FIG. 1 is a plan view of a schematic configuration of an integrated circuit device according to an example embodiment.

The embodiments of the present inventive concept will now be described more fully with reference to the accompanying drawings. Throughout the drawings, like reference numerals denote like elements, and redundant explanations thereof are omitted.

FIG. 1 is a plan view of a schematic configuration of an integrated circuit device 10 according to an example embodiment.

The integrated circuit device 10 may include a substrate 12 that includes a first area 22, a second area 24 surrounding the first area 22, and an interface area 26 between the first area 22 and the second area 24. For example, the interface area 26 may surround the first area 22, and the second area 24 may surround the interface area 26.

The substrate 12 may include, for example, a semiconductor element such as Is or Ge, or at least one compound semiconductor selected from among SiGe, SiC, GaAs, InAs, and InP. The substrate 12 may include a conductive area, for example, a well doped with impurities or a structure doped with impurities.

In some embodiments, the first area 22 may include a memory cell area of the integrated circuit device 10. In some embodiments, the first area 22 may include a memory cell area of dynamic random access memory (DRAM). The first area 22 may include a unit memory cell including a transistor and a capacitor, or a unit memory cell including a switching device and a variable resistor.

The second area 24 may include a core area or a peripheral circuit area (hereinafter, referred to as the "peripheral circuit area"). Peripheral circuits for driving memory cells in the first area 22 may be disposed in the second area 24.

A plurality of conductive lines provided to enable an electric connection between the first area 22 and the second area 24 and insulating structures for insulation between the first area 22 and the second area 24 may be disposed in the interface area 26.

Figure 2:
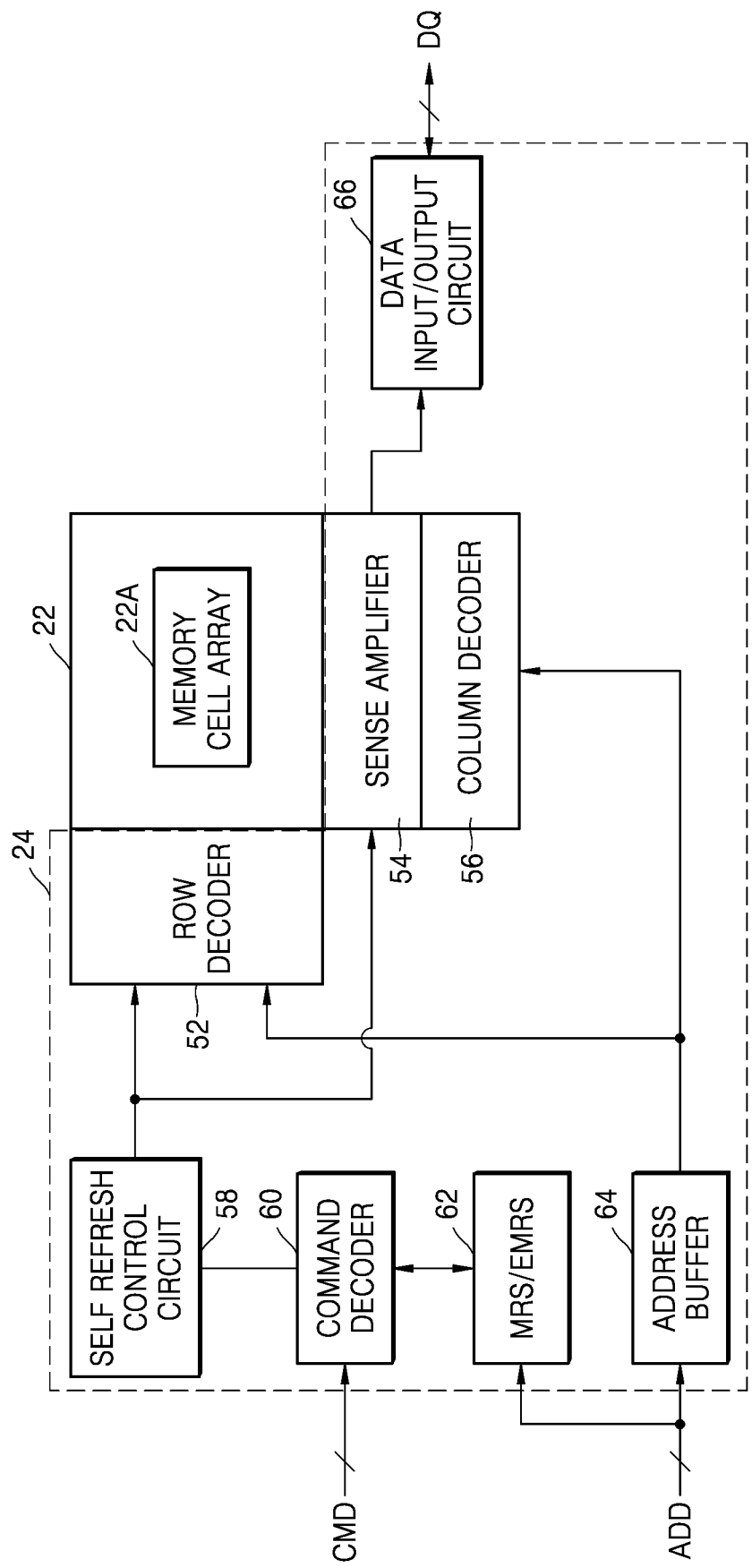
FIG. 2 is a block diagram of an integrated circuit device including a DRAM device.

FIG. 2 is a block diagram of a configuration of an integrated circuit device including a DRAM device.

Referring to FIG. 2, in the integrated circuit device 10, the first area 22 may include a memory cell area of a DRAM device, and the second area 24 may include a peripheral circuit area of the DRAM device. The first area 22 may include a memory cell array 22A. A plurality of memory cells for storing data may be arranged in a row direction and a column direction in the memory cell array 22A. Each of the memory cells may include a cell capacitor and an access transistor. A gate of the access transistor may be connected to a corresponding one of a plurality of word lines arranged in the row direction. One of a source and a drain of the access transistor may be connected to a bit line or a complementary bit line arranged in the column direction, and the other may be connected to the cell capacitor.

The second area 24 may include a row decoder 52, a sense amplifier 54, a column decoder 56, a self-refresh control circuit 58, a command decoder 60, a mode register set/ extended mode register set (MRS/EMRS) circuit 62, an address buffer 64, and a data input/output circuit 66.

The sense amplifier 54 may sense and amplify data of the memory cells of the memory cell array 22A and store data in the memory cells. The sense amplifier 54 may be implemented by a cross-coupled amplifier connected between the bit line and the complementary bit line included in the memory cell array 22A.

Data DQ input through the data input/output circuit 66 may be written to the memory cell array 22A based on an address signal ADD, and the data DQ read out from the memory cell array 22A based on the address signal ADD may be output to the outside through the data input/output circuit 66. To assign a memory cell to write or read data, the address signal ADD may be input to the address buffer 64. The address buffer 64 may temporarily store the address signal ADD input from the outside.

The row decoder 52 may decode a row address of the address signal ADD output from the address buffer 64 to assign a word line connected to a memory cell to or from which data is input or output. For example, in a data write or read mode, the row decoder 52 may decode a row address output from the address buffer 64, thereby enabling a corresponding word line. Furthermore, in a self-refresh mode, the row decoder 52 may decode a row address generated by an address counter (not shown), thereby enabling a corresponding word line.

The column decoder 56 may decode a column address of the address signal ADD output from the address buffer 64 to assign a bit line connected to a memory cell to or from which data is input or output. The memory cell array 22A may output data from the memory cell assigned by the row and column addresses or may write data to the memory cell.

The command decoder 60 may receive a command signal CMD that is externally applied and may internally generate a decoded command signal (e.g., a self-refresh enter command or a self-refresh exit command) by decoding the signal.

The MRS/EMRS circuit 62 may set an internal mode register in response to the address signal ADD and an MRS/EMRS command to assign an operation mode of the integrated circuit device 10.

Although not illustrated in FIG. 2, the integrated circuit device 10 may further include a clock circuit for generating a clock signal and a power circuit for generating or distributing an internal voltage by receiving a power voltage that is externally applied.

The self-refresh control circuit 58, in response to a command output from the command decoder 60, may control a self-refresh operation of the integrated circuit device 10. Although not shown, the command decoder 60 may include an address counter, a timer, and a core voltage generator. The address counter, in response to a self-refresh enter command output from the command decoder 60, may generate a row address to assign a row address subject to self-refresh and apply the row address to the row decoder 52. The address counter may interrupt a counting operation in response to a self-refresh exit command output from the command decoder 60.

Figure 3:
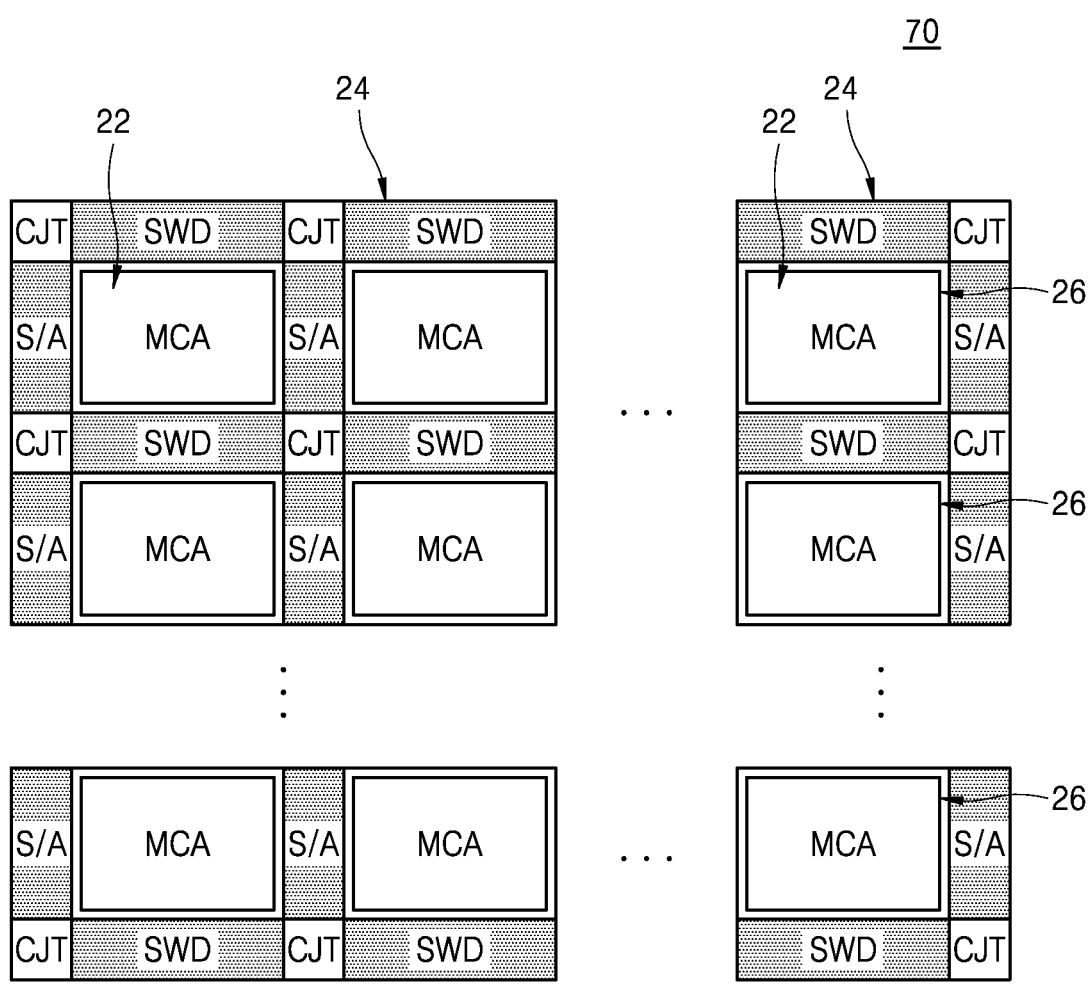
FIG. 3 is a plan view of a schematic configuration of an integrated circuit device according to another example embodiment.

FIG. 3 is a plan view of a schematic configuration of an integrated circuit device 70 according to another example embodiment. In FIGS. 1 and 3, like reference numerals denote like elements, and detailed descriptions thereof are omitted.

Referring to FIG. 3, the integrated circuit device 70 may include a plurality of first areas 22. Each of the first areas 22 may be surrounded by the second area 24 with the interface area 26 therebetween. In the integrated circuit device 70, the first areas 22 may each be a memory cell array area MCA of a DRAM device, and the second area 24 may include a peripheral circuit area of the DRAM device.

In the first areas 22, the memory cell array area MCA may include the memory cell array 22A described with reference to FIG. 2. Each of the first areas 22 may be surrounded by the interface area 26.

The second area 24 may include a sub-word line driver block SWD, a sense amplifier block S/A, and a conjunction block CJT. In the second area 24, a plurality of sub-word line driver blocks SWD may be arranged in a word line direction of the memory cell array area MCA, and a plurality of sense amplifier blocks S/A may be arranged in a bit line direction. A plurality of bit-line sense amplifiers may be arranged in the sense amplifier block S/A. The conjunction block CJT may be located at an intersection of the sub-word line driver block SWD and the sense amplifier block S/A. Power drivers for driving the bit-line sense amplifiers and ground drivers may be alternately arranged in the conjunction block CJT.

Although not illustrated in FIG. 3, a peripheral circuit such as an inverter chain or an input/output circuit may be further provided in the second area 24.

Figure 4:
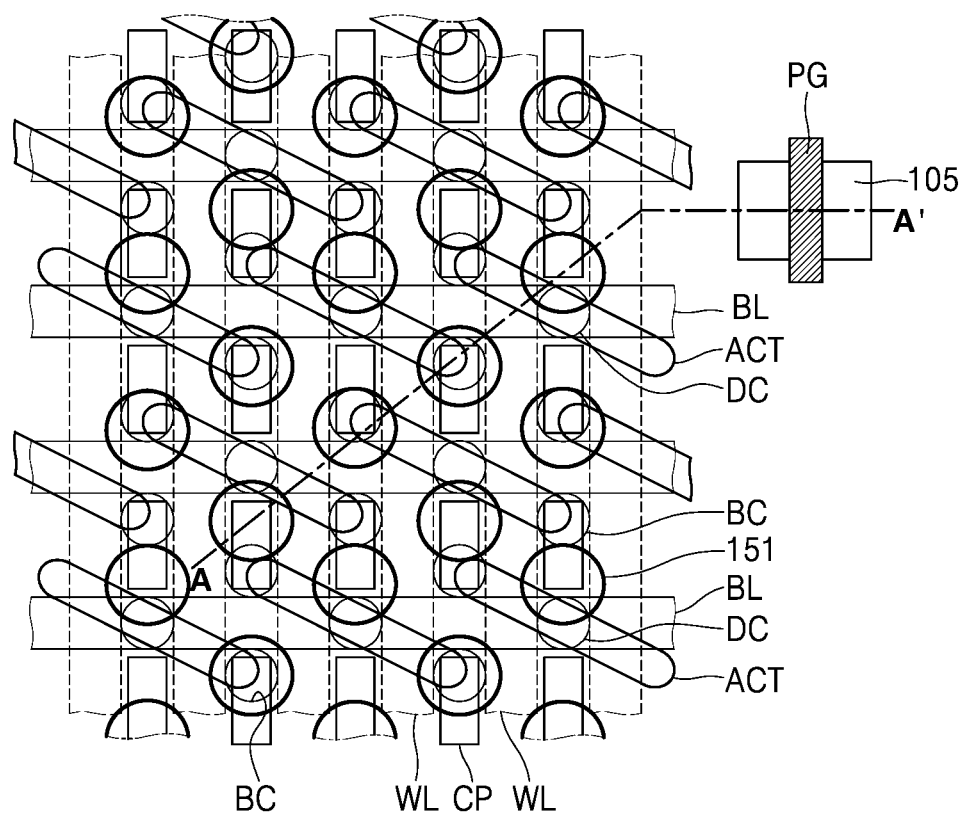
FIG. 4 is a plan view of a layout of a semiconductor device according to an example embodiment.
Figure 5:
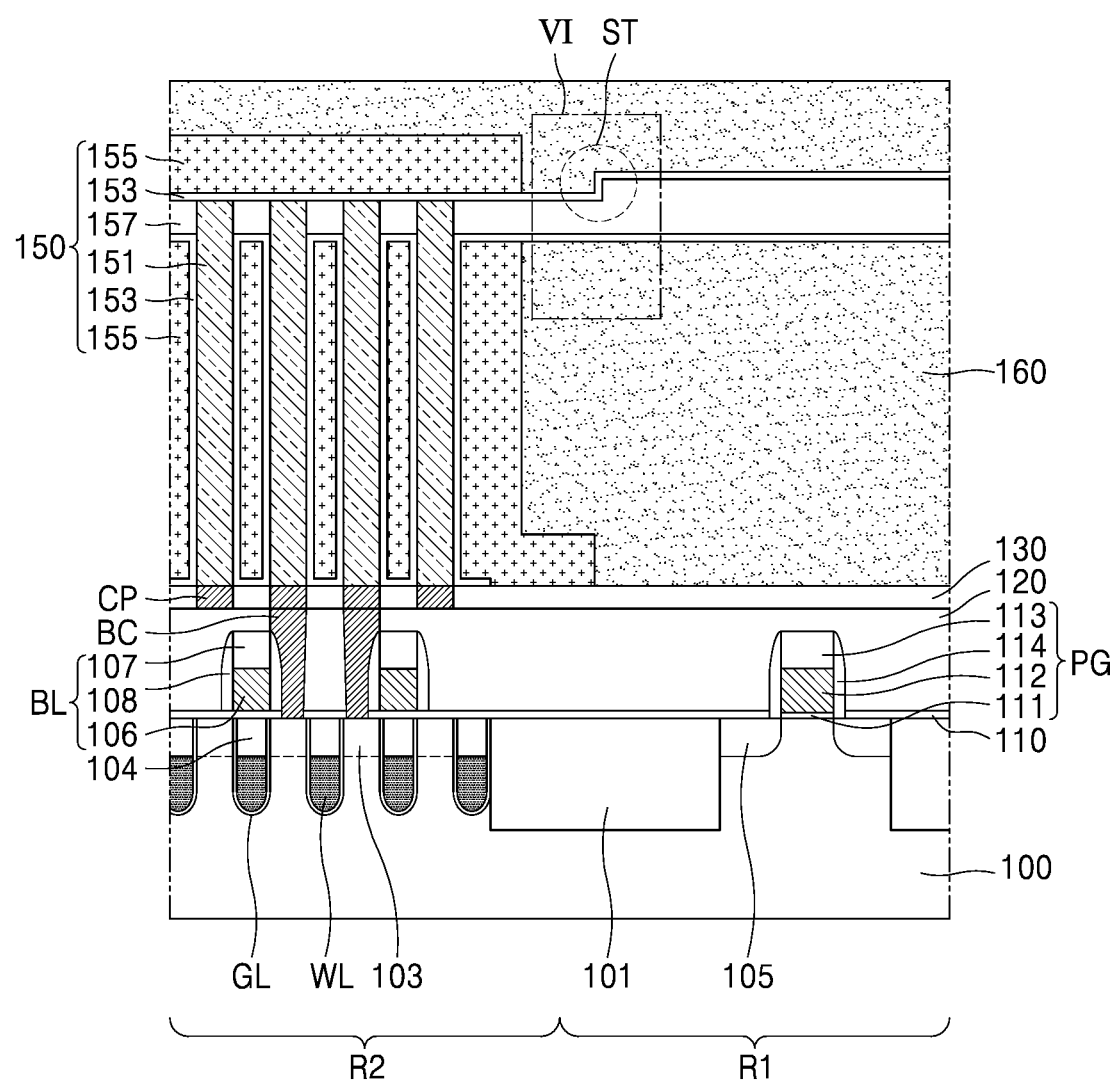
FIG. 5 is a side cross-sectional view taken along line A-A' of FIG. 4.

FIG. 4 is a plan view of a layout of a semiconductor device 1 according to an example embodiment. FIG. 5 is a side cross-sectional view taken along line A-A' of FIG. 4.

Referring to FIGS. 4 and 5, a semiconductor substrate 100 may include a first area R1 and a second area R2. For example, the first area R1 may include a peripheral circuit area, and the second area R2 may include a cell area.

In some embodiments, a peripheral circuit including row and column decoders, a page buffer, and an input/output circuit may be disposed on the semiconductor substrate 100 of the first area R1. In some embodiments, the peripheral circuit may include CMOS transistors, a resistor, and capacitors, which are electrically connected to the memory cell array.

In some embodiments, a memory cell array including a plurality of memory cells may be disposed on the semiconductor substrate 100 of the second area R2. The memory cell array may include a plurality of memory cells and a plurality of word lines WL and bit lines BL electrically connected to the memory cells. In some embodiments, each of the memory cells may include a capacitor 150 that includes a lower electrode 151, an upper electrode 155, and a dielectric film 153 therebetween. For example, the dielectric film 153 may contact upper and side surfaces of the lower electrode 151, and the dielectric film 153 may contact upper, lower, and side surfaces of the upper electrode 153. Furthermore, as a support layer 157 horizontally connects the lower electrodes 151 of the memory cells, the lower electrodes 151 may be prevented from collapsing. An upper surface of the support layer 157 may contact a lower surface of the dielectric film 153, and side surfaces of the support layer 157 may contact side surfaces of upper portions of the lower electrodes 151. In some embodiments, the support layer 157 may surround the upper portions of the lower electrodes 151.

In detail, a device isolation layer 101 defining active areas ACT may be formed on the semiconductor substrate 100 of the second area R2. Each of the active areas ACT may have a bar shape, and the major axis of each of the active areas ACT may be disposed in a direction oblique to the word lines WL and the bit lines BL.

The word lines WL may be disposed across the active areas ACT. In some embodiments, the word lines WL may be formed by providing a gate insulating film GL in a recess area that is recessed to a certain depth from a surface of the active areas ACT. Furthermore, upper surfaces of the word lines WL may be located at a level lower than an upper surface of the active areas ACT, and the recess areas where the word lines WL are formed may be filled with a capping layer 104 including an insulating material.

A plurality of impurity areas 103 such as a source area and a drain area may be formed in the active areas ACT at both sides of the word lines WL. The impurity areas 103 may form a plurality of MOS transistors with the word lines WL. For example, each of the plurality of MOS transistors may comprise an impurity area 103 and a gate structure including the gate insulating film GL, a word line WL, and the capping layer 104.

The bit lines BL may be disposed across the word lines WL on the semiconductor substrate 100 of the first area R1. Each of the bit lines BL may include a conductive line 106, a capping layer 107, and spacers 108. A first interlayer insulating film 110 may be between the bit lines BL and the semiconductor substrate 100. Bit line contact plugs DC electrically connecting the impurity areas 103 to the bit lines BL may be formed in the first interlayer insulating film 110.

The first interlayer insulating film 110 may include a high density plasma (HDP) oxide film, tetraethyl ortho silicate (TEOS), plasma enhanced TEOS (PE-TEOS), O3-TEOS, undoped silicate glass (USG), phospho silicate glass (PSG), borosilicate glass (BSG), borophosphosilicate glass (BPSG), fluoride silicate glass (FSG), spin on glass (SOG), tonen silazene (TOSZ), or a combination thereof. Alternatively, the first interlayer insulating film 110 may include a silicon nitride, a silicon oxynitride, or a low-k material having a low dielectric constant.

Furthermore, the device isolation layer 101 may define a peripheral active area in the semiconductor substrate 100 of the first area R1. A peripheral gate electrode structure PG may be disposed across the peripheral active area, and peripheral source and drain areas 105 may be formed in the peripheral active area at both sides of the peripheral gate electrode structure PG. The peripheral gate electrode structure PG may include a gate insulating layer 111, a gate electrode 112, a gate capping layer 113, and spacers 114.

A second interlayer insulating film 120 may cover the bit lines BL of the second area R2 and the peripheral gate electrode structure PG of the first area R1. The second interlayer insulating film 120 may include an HDP oxide film. TEOS, PE-TEOS, O3-TEOS, USG, PSG, BSG, BPSG, FSG, SOG, TOSZ or a combination thereof. Alternatively, the second interlayer insulating film 120 may include a silicon nitride, a silicon oxynitride, or a low-k material having a low dielectric constant.

A plurality of contact plugs BC electrically connecting a data storage element, that is, the capacitor 150, to the impurity areas 103 may be formed in the second interlayer insulating film 120 of the second area R2. In some embodiments, the contact plugs BC may be disposed in the active areas ACT at both sides each of the bit lines BL. Furthermore, the contact plugs BC may be arranged in the form of continuous regular triangles, a honeycomb, or zigzag, when viewed in a plan view.

Furthermore, the contact plugs BC may be formed by forming contact holes exposing the impurity areas 103 in the second interlayer insulating film 120, depositing a conductive layer for burying the contact holes, and planarizing and node-separating the conductive layer. The contact plugs BC may include any one of an impurity-doped polysilicon layer, a metal layer, a conductive metal nitride layer, and a metal silicide layer, or a combination thereof.

In some embodiments, a plurality of contact pads CP may be respectively formed on the contact plugs BC. The contact pads CP may be arranged two-dimensionally on the second interlayer insulating film 120 of the second area R2. The contact pads CP may increase a contact area between the lower electrode 151 of the capacitor 150 formed thereon and each of the contact plugs BC. A top surface of the contact pads CP may contact bottom surfaces of respective lower electrodes 151, and bottom surface of the contact pads CP may contact top surfaces of respective contact plugs BC. The contact pads CP may have a shape in which the two contact pads CP neighboring with respect to each of the bit lines BL therebetween extend in the opposite directions.

A third interlayer insulating film 130 may be formed between the contact pads CP. The third interlayer insulating film 130 may be formed on a top surface of the second interlayer insulating film 120. A top surface of the third interlayer insulating film 130 may be coplanar with top surfaces of the contact pads CP, and a bottom surface of the third interlayer insulating film 130 may be coplanar with bottom surfaces of the contact pads CP. The third interlayer insulating film 130 may include an HDP oxide film, TEOS, PE-TEOS, O3-TEOS. USG, PSG, BSG, BPSG, FSG, SOG, TOSZ, or a combination thereof. Alternatively, the third interlayer insulating film 130 may include a silicon nitride, a silicon oxynitride, or a low-k material having a low dielectric constant.

The lower electrodes 151 of the capacitor 150 may be formed on each of the contact pads CP. In some embodiments, the lower electrodes 151 may be arranged in the form of continuous regular triangles, a honeycomb, or zigzag, when viewed in in a plan view.

The lower electrodes 151 may be supported by the support layer 157. The lower electrodes 151 may have a high aspect ratio of about 10 to 40, and when the support layer 157 is omitted, the lower electrodes 151 may fall to the side and collapse or may be in contact with the neighboring lower electrodes 151. Accordingly, to prevent the collapse of the lower electrodes 151, the support layer 157 is provided, thereby preventing the lower electrodes 151 from falling to the side or collapsing.

The support layer 157 may have a step ST between the first area R1 and the second area R2. The "step" may signify that there is a level difference between upper surfaces of the support layer 157 in the first area R1 and the support layer 157 in the second area R2, which is described below in detail.

The dielectric film 153 may be conformally formed on surfaces of the lower electrodes 151. For example, the dielectric film 153 may be formed on upper and side surfaces of the lower electrodes 151 and the support layer 157. The upper electrode 155 may be formed on the dielectric film 153. After the capacitor 150 is formed in the second area R2, an embedded insulating film 160 covering the first area R1 and the second area R2 may be formed.

Figure 6:
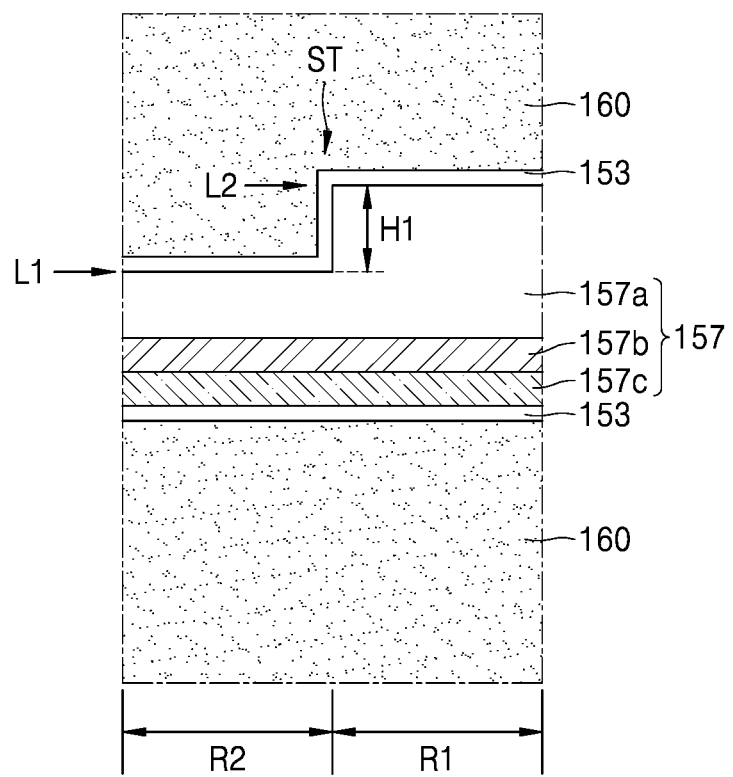
FIG. 6 is a partially enlarged view of a portion VI of FIG. 5.

FIG. 6 is a partially enlarged view of a region VI of FIG. 5.

Referring to FIG. 6, the support layer 157 may have the step ST between the first area R1 and the second area R2. The support layer 157 may include a first sub-layer 157a, a second sub-layer 157b, and a third sub-layer 157c.

The first sub-layer 157a is not particularly limited and may include a material having a sufficient etch selectivity with respect to a mask pattern provided to form a pattern on the support layer 157. For example, the first sub-layer 157a may include a silicon nitride, a silicon carbide, a silicon carbo-nitride (SiCN), or a combination thereof. The second sub-layer 157b may include a silicon nitride, a silicon oxide, a silicon oxynitride, or a combination thereof. In particular, the second sub-layer 157b may be doped with at least one element such as boron (B), carbon (C), and aluminum (Al). The third sub-layer 157c may include a silicon nitride, a silicon oxide, a silicon oxynitride, or a combination thereof.

An upper surface of the support layer 157 has a first level L1 in the second area R2 and a second level L2 in the first area R1. The second level L2 may be higher than the first level L1, and a height difference HI therebetween may be about 2 nm to about 20 nm, or about 3 nm to about 10 nm. The portion of the upper surface of the support layer 157 having the first level L1 and the portion of the upper surface of the support layer 157 having the second level L2 may be connected by a vertical sidewall of the support layer 157. The vertical sidewall of the support layer 157 may be at the boundary of the first area R1 and the second area R2.

In some embodiments, the second sub-layer 157b and the third sub-layer 157c may have a substantially constant thickness across the first area R1 and the second area R2. As used herein, thickness may refer to the thickness or height measured in a direction perpendicular to a top surface of the substrate 100. In this case, a level difference and a thickness difference of the support layer 157 between the first area R1 and the second area R2 may be generated by a level difference and a thickness difference of the first sub-layer 157a. A step of the support layer 157 between the first area R1 and the second area R2 may be substantially the same as a step of the first sub-layer 157a between the first area R1 and the second area R2.

In some embodiments, the first level L1 may be substantially the same as a level of an upper end of the lower electrodes 151 of FIG. 5. In some embodiments, the upper surface of the support layer 157 in the second area R2 may be on substantially the same plane as the upper surfaces of the lower electrodes 151 (coplanar). As used herein, terms such as "same," "equal," "planar," or "coplanar," when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Figure 7:
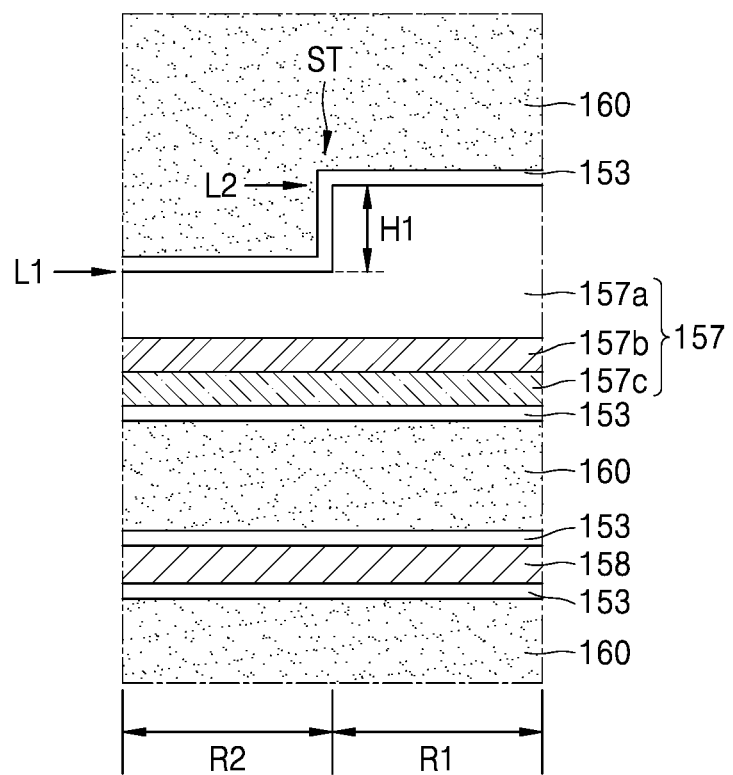
FIG. 7 illustrates in detail the portion VI according to another example embodiment.

FIG. 7 illustrates in detail the region VI according to another embodiment. The embodiment of FIG. 7 is the same as the embodiment of FIG. 6, except that a lower support layer 158 is further provided. Accordingly, the following description mainly focuses on the difference.

Referring to FIG. 7, when the lower support layer 158 is further provided, the lower electrodes 151 may be supported well. Although FIG. 7 illustrates two support layers 157 and 158, more support layers may be provided.

The lower support layer 158 may include a silicon nitride, a silicon carbide, a silicon nitride, carbide (SiCN), or a combination thereof.

Figure 8:
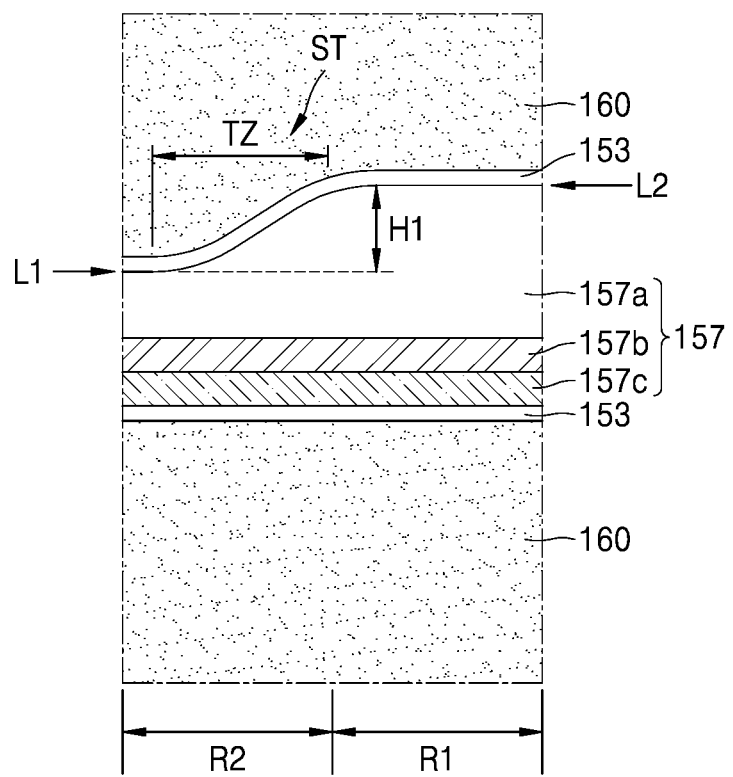
FIG. 8 illustrates in detail the portion VI according to another example embodiment.

FIG. 8 illustrates in detail the region VI according to another embodiment.

Referring to FIG. 8, the step ST between the first area R1 and the second area R2 may be a step ST having a level that gradually changes around a boundary between the first area R1 and the second area R2. For example, as shown in FIG.

8, the support layer 157 may have an upper surface level that gradually changes over a certain horizontal length TZ around the boundary between the first area R1 and the second area R2.

As described below in detail, the step ST between the first area R1 and the second area R2 may be generated due to a loading effect occurring when a recess pattern is formed by using a mask pattern (190m) (see FIG. 9D). Accordingly, although the step ST may be generated to be sharp between the first area R1 and the second area R2 (e.g., FIGS. 6 and 7), as the loading effect is gradually expressed, the step ST may be expressed in the form of a gradual level change.

FIGS. 9A to 9L are side cross-sectional views sequentially showing a method of forming a semiconductor device, according to an example embodiment.

Figure 9A:
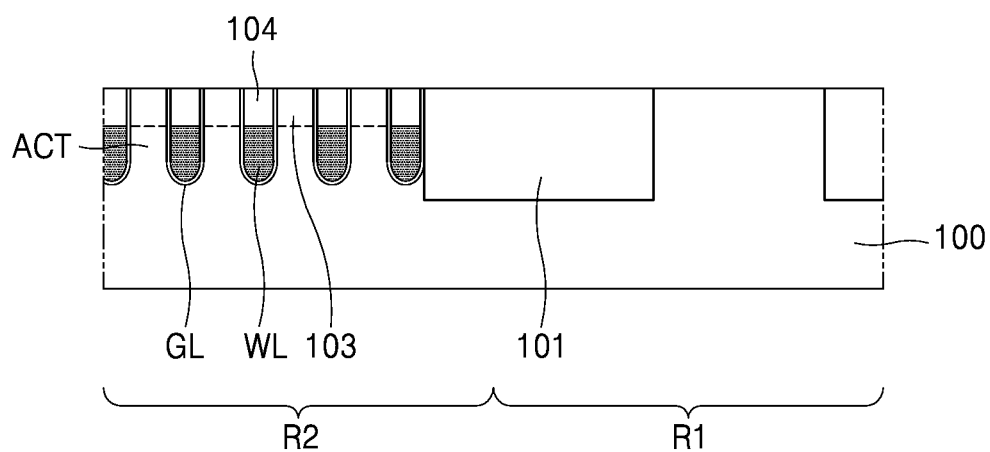
FIGS. 9A to 9L are side cross-sectional views sequentially showing a method of forming a semiconductor device, according to an example embodiment.

Referring to FIG. 9A, the semiconductor substrate 100 including the first area R1 and the second area R2 may be provided. As the semiconductor substrate 100 is described above in detail with reference to FIG. 5, a description thereof is omitted.

The active area ACT may be defined by forming the device isolation layer 101 in the semiconductor substrate 100. A gate insulating film GL and the word lines WL may be formed after a recess extending across the active area ACT is formed. A capping layer 104 including an insulating material may be formed above the word lines WL. Also, an impurity area 103 may be formed by injecting impurities into the active area ACT at both sides of each of the word lines WL. The impurity area 103 may serve as a source area or a drain area. The word lines WL and the source area and the drain area may constitute a transistor device.

Figure 9B:
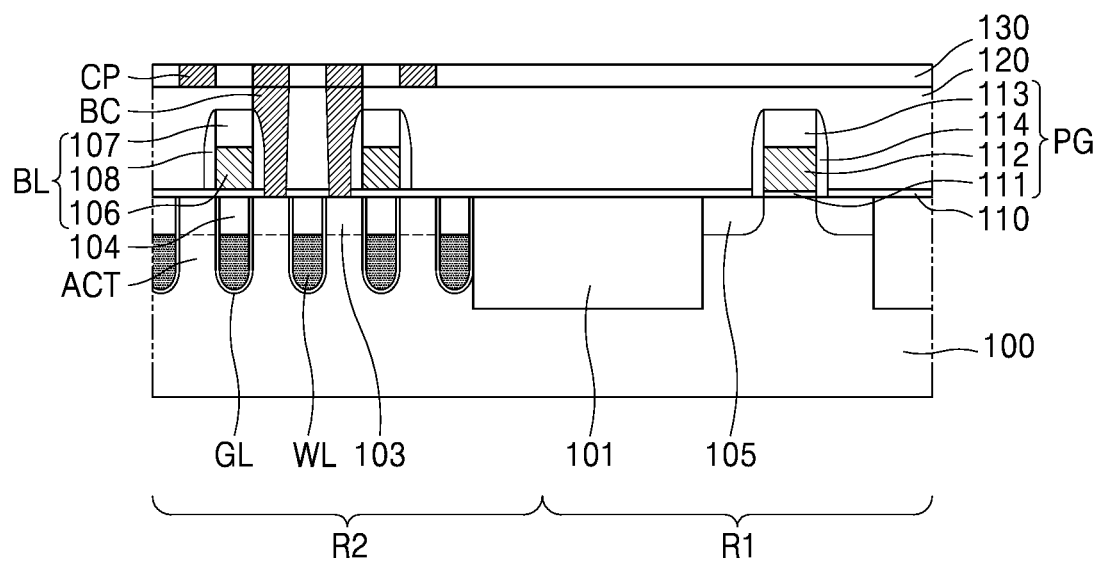

Referring to FIG. 9B, the first interlayer insulating film 110 may be formed to completely cover the active areas ACT. The first interlayer insulating film 110 may be provided with a bit line contact plug DC that may be electrically connected to the bit lines BL later. The first interlayer insulating film 110 may include a silicon oxide. Each of the bit lines BL may include a conductive line 106, a capping layer 107, and spacers 108.

Furthermore, the peripheral gate electrode structure PG may be formed in the first area R1, and a transistor for a peripheral circuit area may be provided by forming an impurity area 105 at both sides of the peripheral gate electrode structure PG. The peripheral gate electrode structure PG may include a gate insulating layer 111, a gate electrode 112, a gate capping layer 113, and spacers 114.

After the bit lines BL are formed to be electrically connected to the bit line contact plug DC, the second interlayer insulating film 120 may be formed to cover the bit lines BL. The contact plugs BC may be provided in the second interlayer insulating film 120. The contact plugs BC may penetrate the first interlayer insulating film 110 and the second interlayer insulating film 120 to be electrically connected to the impurity area 103.

Each of the contact plugs BC and the bit line contact plugs DC may independently include doped polysilicon, metal, a conductive metal nitride, a metal silicide, or a combination thereof.

In FIG. 9B, although the bit line contact plugs DC connected to the bit lines BL are not seen, when one of ordinary skill in the art takes another appropriate cross-section different from the cross-section of FIG. 9B, the bit line contact plug connected to the bit lines BL may be seen.

Next, the third interlayer insulating film 130 covering the second interlayer insulating film 120 may be formed. The contact pads CP may be provided in the third interlayer insulating film 130. The contact pads CP may be in contact with the contact plugs BC. In FIG. 9B, the contact pads CP that are not shown to be in contact with the contact plugs BC may be those that are electrically connected to the contact plugs BC located farther from the cross-section in a direction of sight.

Figure 9C:
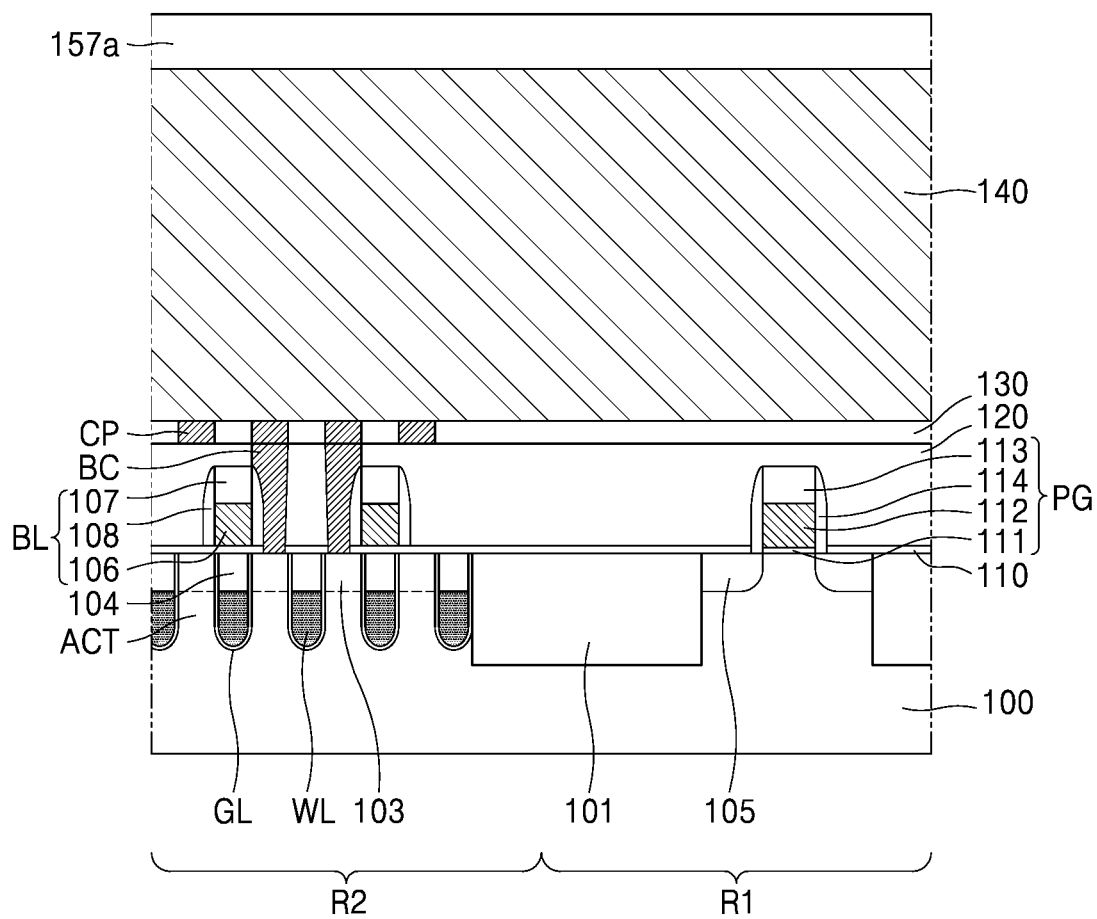

Referring to FIG. 9C, a mold layer 140 and a support material layer 157a may be formed on the third interlayer insulating film 130. The mold layer 140 may include, for example, a silicon oxide, and may be formed, for example, by chemical vapor deposition (CVD). For example, the mold layer 140 may include a borophosilicate glass (BPSG) film or an undoped silicate glass (USG) film. The thickness of the mold layer 140 may be defined by a distance from a lower surface of the mold layer 140 to an upper surface thereof and may be determined by considering the height of a capacitor lower electrode to be formed. For example, the thickness of the mold layer 140 may be about 200 nm to about 4000 nm.

The support material layer 157a may include a material having a sufficient etch selectivity with respect to the mold layer 140. Also, the support material layer 157a may include a material having a relatively low etch rate in an etching atmosphere used to remove the mold layer 140 in the subsequent process, for example, in an etchant lift-off process using ammonium fluoride ($NH_4F$), hydrofluoric acid (HF), and water.

In some embodiments, the support material layer 157a may include a silicon nitride, a silicon carbo-nitride, a silicon oxide, a silicon germanium (SiGe), a tantalum oxide, a titanium oxide, or a combination thereof, but the constituent material of the support material layer 157a is not limited thereto.

In some embodiments, the support material layer 157a may have a multi-membrane structure. For example, the support material layer 157a may have a multi-membrane structure in which at least two films selected from a silicon nitride film, a silicon carbo-nitride film, a tantalum oxide film, and a titanium oxide film are sequentially stacked.

The support material layer 157a may have a thickness of, for example, about 100 nm to about 100 nm.

Figure 9D:
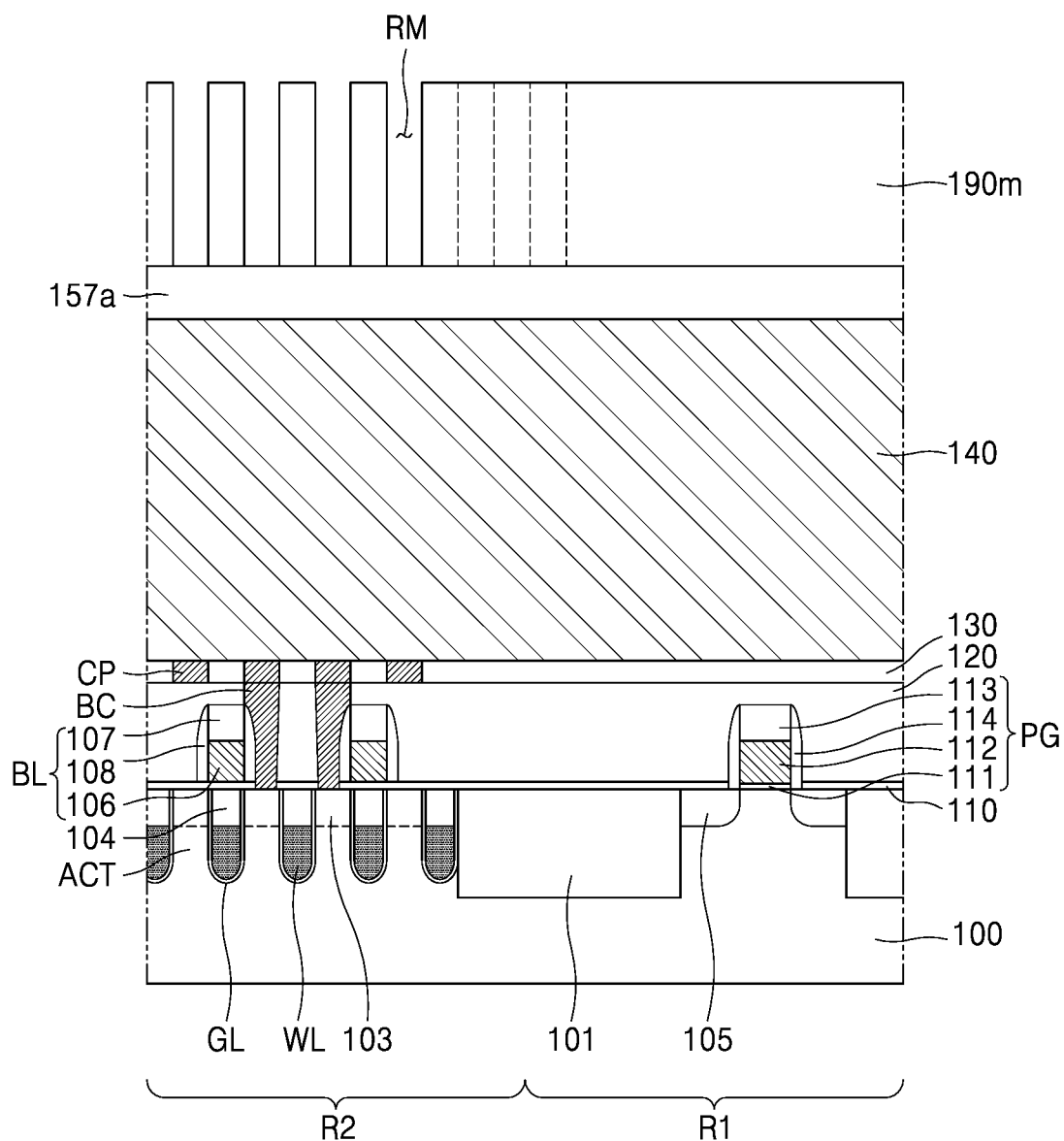

Referring to FIG. 9D, a mask pattern 190m may be formed on the support material layer 157a. In some embodiments, the mask pattern 190m may be a hard mask pattern. In some embodiments, the mask pattern 190m may include polysilicon, a silicon nitride, a silicon oxide, a silicon oxynitride, a spin-on-hard mask (SOH), an amorphous carbon layer (ACL), or a combination thereof.

The mask pattern 190m may be obtained by forming a layer of a mask pattern material film and then applying a photolithography method thereto. In detail, a layer of a mask pattern material film is formed and a photoresist pattern is formed thereon by a photolithography method. Then, the layer of the mask pattern material film is patterned by using the photoresist pattern as an etch mask, thereby forming the mask pattern 190m. After obtaining the mask pattern 190m, the photoresist pattern may be removed by a method such as ashing.

The mask pattern 190m may have a higher pattern density in the second area R2 than in the first area R1. For example, the pattern density of the mask pattern 190m in the second area R2 may be greater than the pattern density of the mask pattern 190m in the first area R1. In FIG. 9D, a plurality of recess patterns RM are illustrated to be formed in the mask pattern 190m of the second area R2. Furthermore, in FIG. 9D, the recess patterns RM that are formed in a portion of the second area R2 close to the first area R1 but not seen in the cross-section is indicated by a dashed line.

Figure 9E:
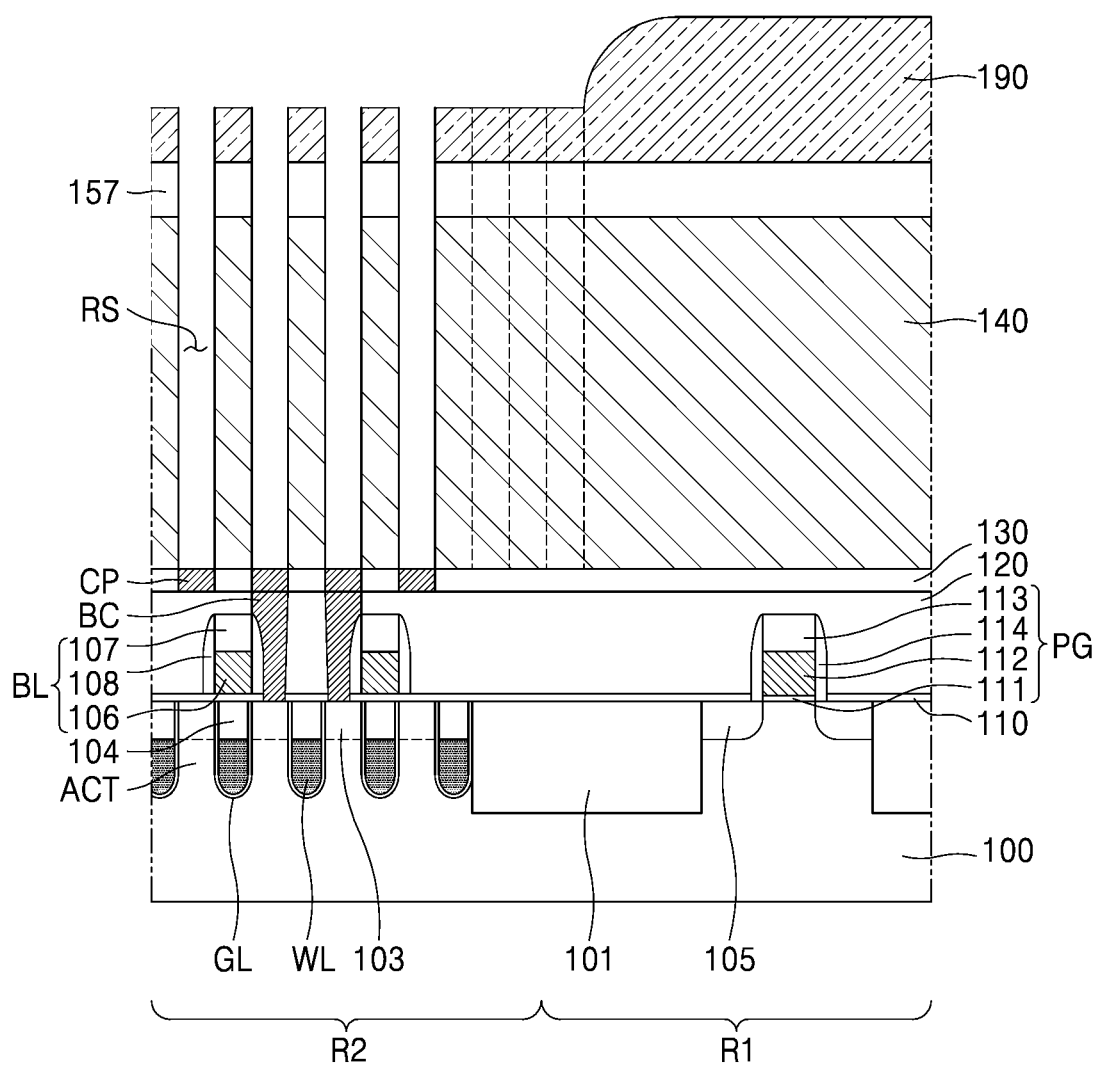

Referring to FIG. 9E, recess patterns RS may be formed at a position where a lower electrode is to be formed by patterning the support material layer 157a and the mold layer 140 using the mask pattern 190m as an etch mask. The recess patterns RS may expose each of the contact pads CP. When no contact pad CP is formed, the recess patterns RS may expose the contact plugs BC at a position corresponding to the lower electrode.

The recess patterns RS may be formed by anisotropic etching. The anisotropic etching may be performed by a method, for example, HDP etching, reactive ion etching, sputter etching, or reactive ion beam etching. However, the present inventive concept is not limited thereto.

The width of each of the recess patterns RS may be constant according to the height thereof, or may increase away from the semiconductor substrate 100. For example, widths of the recess patterns RS may be substantially the same along the entire length thereof, or may become greater toward upper portions of the recess patterns RS. For example, the width of a pattern of the mold layer 140 may be constant along the entire length thereof, or may decrease away from the semiconductor substrate 100.

A mask pattern 190 having a shape shown in FIG. 9E may be obtained by partially removing an upper portion of the mask pattern 190m due to anisotropic etching for forming the recess patterns RS. As shown in FIG. 9E, it may be seen that the height or amount of the mask pattern 190 remaining in the first area R1 is greater than the height or amount of the mask pattern 190 remaining in the second area R2.

Although the present inventive concept is not intended to be limited to a specific theory, a height difference of the mask pattern 190 according to the area may be based on a loading effect. In detail, in the first area R1 in which a pattern density is relatively low, the mask pattern 190m of FIG. 9D appears to have a relatively two-dimensional removal, whereas, in the second area R2 in which the pattern density is relatively high, the mask pattern 190m of FIG. 9D appears to have a relatively three-dimensional removal. Accordingly, a removal rate of the mask pattern 190m in the second area R2 may be faster than that of the mask pattern 190m in the first area R1. As a result, the thickness of the mask pattern 190 in the first area R1 may be greater than that of the mask pattern 190 in the second area R2.

The mask pattern 190 may have an upper surface that has a relatively radically change in height around the boundary between the first area R1 and the second area R2, as shown in FIG. 9E. However, when a loading effect occurs more gradually between the first area R1 and the second area R2, the upper surface of the mask pattern 190 may change at a gentler inclination over a longer distance in a horizontal direction.

For a subsequent process, the mask pattern 190 may be selectively removed by etching. However, as the thickness of the mask pattern 190 in the first area R1 is greater than that of the mask pattern 190 in the second area R2, a remaining portion of the mask pattern 190 in the first area R1 may continue to be removed for a certain period of time even after the removal of the mask pattern 190 in the second area R2 is completed. For example, removal of the mask pattern 190 in the second area R2 may be completed sooner than removal of the mask pattern 190 in the first area R1. While the remaining portion of the mask pattern 190 is removed in the first area R1 for a certain period of time, the support layer 157 may be partially removed in the second area R2.

When the mask pattern 190 is removed by dry etching according to the related art, as an etch selectivity of the remaining mask pattern 190 in the first area R1 to the support layer 157 in the second area R2 is relatively low, the support layer 157 in the second area R2 may be considerably etched and removed. As an upper end portion of a capacitor that is generated is substantially the same as a level of the upper surface of the support layer 157 of a cell area (corresponding to the second area R2), the considerable removing of the support layer 157 causes much reduction of the height of the capacitor, which causes reduction of capacitance of the capacitor that is formed.

In the present embodiment, the mask pattern 190 is removed by using dry cleaning instead of dry etching according to the related art. When dry cleaning is used, as an etch selectivity of the remaining mask pattern 190 in the first area R1 to the support layer 157 in the second area R2 is considerably high, the loss of the support layer 157 in the second area R2 by the dry cleaning is negligible.

However, when the dry cleaning is used, it is observed that the mold layer 140 is damaged. Accordingly, to prevent damage to the mold layer 140, a protection film may be formed in the recess pattern RS. The process is described with reference to FIG. 9F.

Figure 9F:
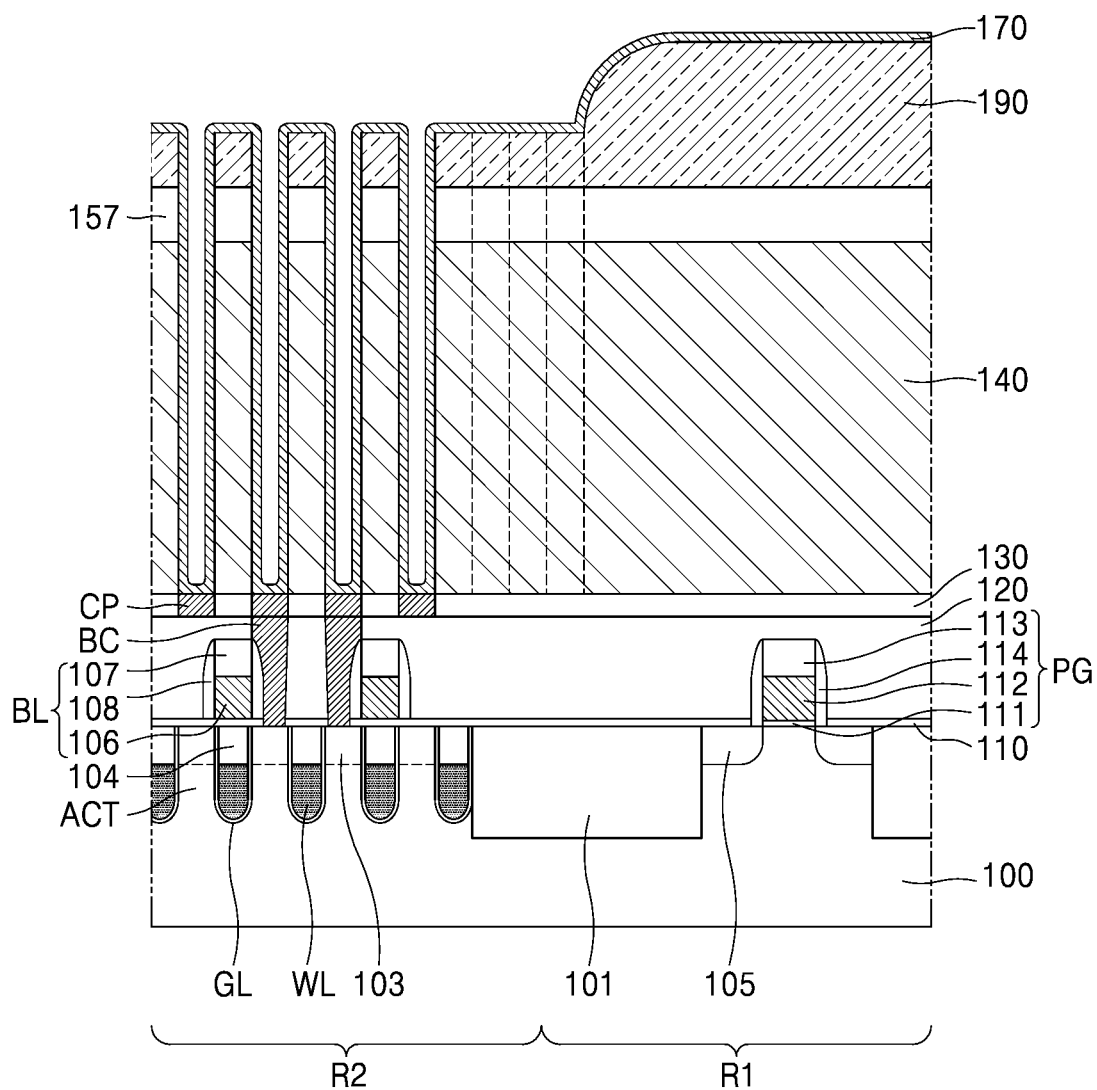

Referring to FIG. 9F, a protection film 170 for lining an inner surface of the recess pattern RS may be formed. In some embodiments, the protection film 170 may be formed not only on the inner surface of the recess pattern RS, but also on the exposed surface of the mask pattern 190.

The protection film 170 may include a material that survives without being removed in the dry cleaning. For example, the protection film 170 may include a metal nitride, for example, a titanium nitride (TiN) or a tungsten nitride (WN), but the present inventive concept is not limited thereto.

The protection film 170 may be formed by using a method, for example, CVD or atomic layer deposition (ALD), but the present inventive concept is not limited thereto. When an ALD method is used, the protection film 170 may be formed relatively conformally on the inner surfaces of the recess patterns RS.

The protection film 170 may have a thickness of, for example, about 0.7 nm to about 5 nm. When the thickness of the protection film 170 is too small, a function to protect the inner surfaces of the recess pattern RS may be poor. In contrast, when the thickness of the protection film 170 is too large, a manufacturing time may become longer and a possibility of particle contamination may increase.

Figure 9G:
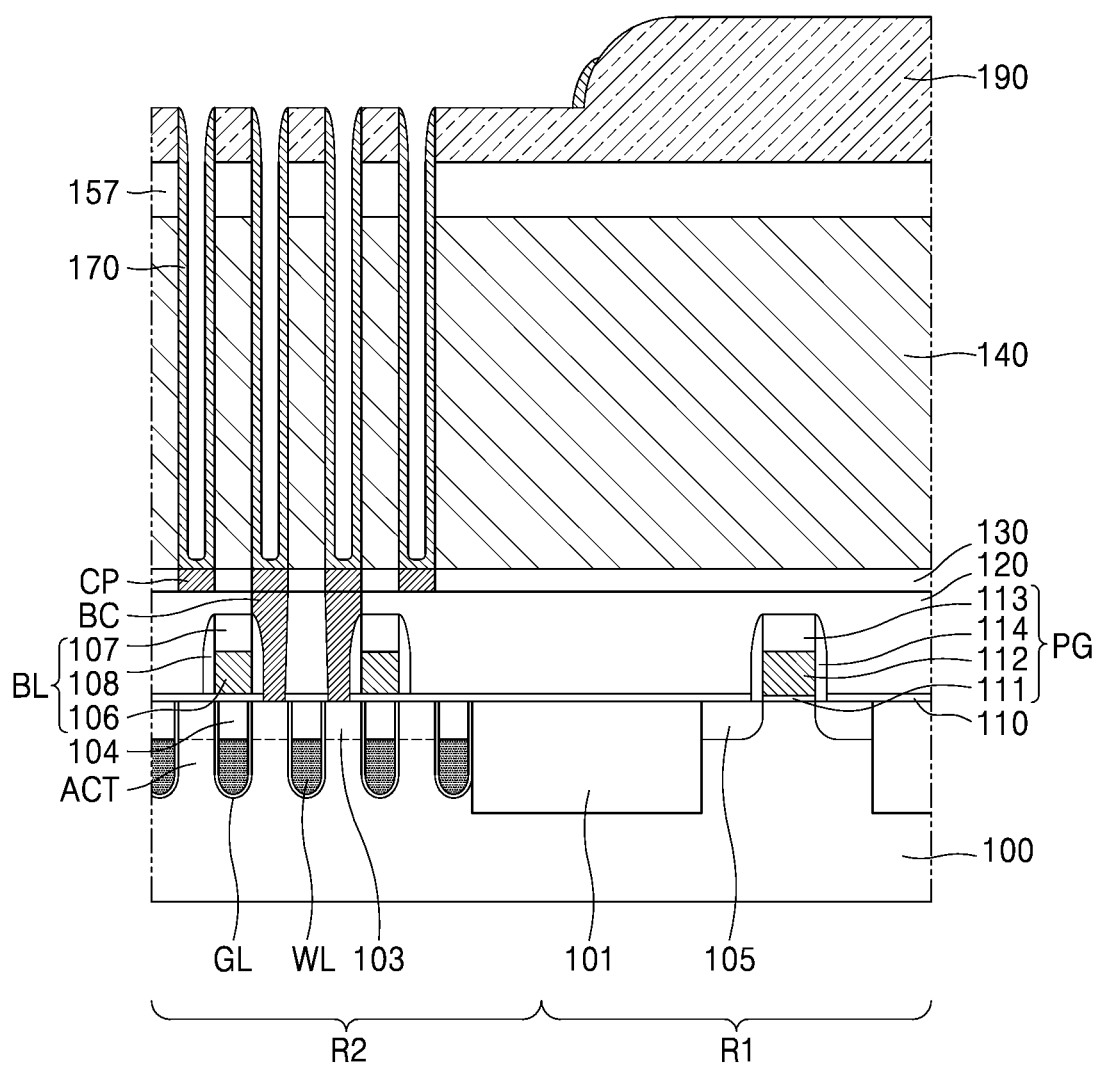

Referring to FIG. 9G, at least a part of the mask pattern 190 may be exposed by partially removing the protection film 170.

In some embodiments, the protection film 170 may be partially removed by etch back and/or chemical mechanical polishing (CMP).

When the protection film 170 is etched back in the second area R2, as illustrated in FIG. 9G, while lining the inner surfaces of the recess patterns RS, an upper surface of the mask pattern 190 may be exposed.

When the protection film 170 is etched back in the first area R1, most of the protection film 170 is etched and removed, and only a portion of the protection film 170 may remain on a side wall of the mask pattern 190.

Figure 9H:
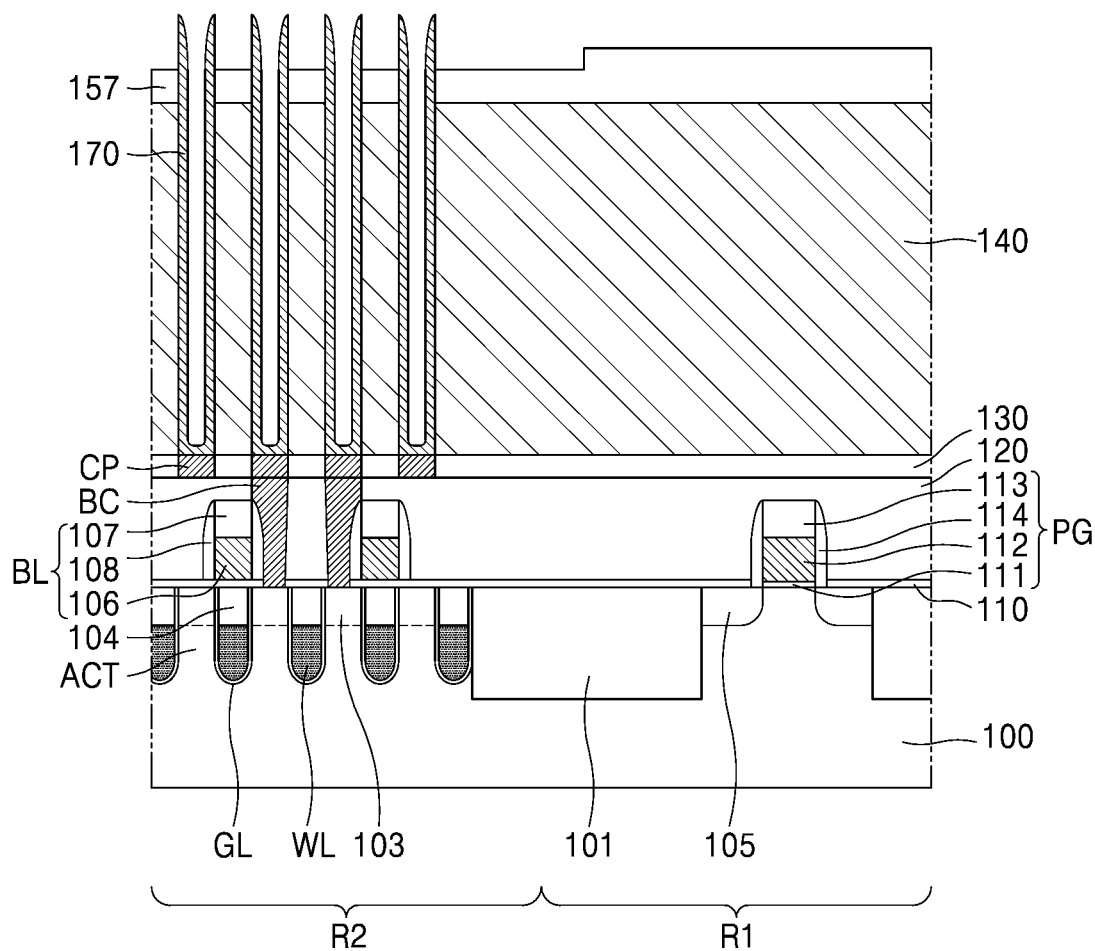

Referring to FIG. 9H, the mask pattern 190 may be removed by dry cleaning.

The dry cleaning may be performed when a bias is not applied by using a plasma gas including a radical of species such as fluorine. Accordingly, in the dry cleaning, the mask pattern 190 may be removed isotropically. In some embodiments, in the dry cleaning, the plasma gas may not include ions of species.

A plasma gas including a radical of species may be supplied to the mask pattern 190 after being generated by a remote method, but the present inventive concept is not limited thereto. In some embodiments, a fluorine radical in the plasma gas may remove the mask pattern 190 by dry cleaning that reacts with silicon of polysilicon forming the mask pattern 190 as follows.

$$Si + 4F \rightarrow SiF_4$$

For example, $C_3F_8$, $C_2F_6$, or $CF_4$ may be used as a supply source of fluorine, but the present inventive concept is not limited thereto.

In some embodiments, when the dry cleaning is in use, an etch selectivity of the remaining mask pattern 190 in the first area R1 to the support layer 157 in the second area R2 may be about 500:1 to about 1000:1, or about 700:1 to about 900:1.

In detail, as described above with reference to FIG. 9E, as the thickness of the mask pattern 190 in the first area R1 is greater than the thickness of the mask pattern 190 in the second area R2, the remaining mask pattern 190 may continue to be removed in the first area R1 for a certain period of time even after the mask pattern 1990 is completely removed in the second area R2. While the remaining mask pattern 190 is removed in the first area R1 for the certain period of time, the support layer 157 may be partially removed in the second area R2.

In this state, the amount of the remaining mask pattern 190 removed in the first area R1 and the amount of the support layer 157 removed in the second area R2, by the dry cleaning may be about 500:1 to about 1000:1, or about 700:1 to about 900:1, with respect to the same period of time.

In some embodiments, while the remaining mask pattern 190 is removed in the first area R1 for the certain period of time, the height of the support layer 157 lost by the dry cleaning in the second area R2 may be about 2 nm to about 20 nm, or about 3 nm to about 10 nm.

For example, while the remaining mask pattern 190 is removed in the first area R1 for the certain period of time, the support layer 157 is lost in the second area R2 by the dry cleaning, the step ST (see FIG. 5) is generated between the first area R1 and the second area R2. Accordingly, the size of the step between the first area R1 and the second area R2 may be substantially the same as or at least proportional to the height of the support layer 157 lost by the dry cleaning. In some embodiments, the size of the step between the first area R1 and the second area R2 may be about 2 nm to about 20 nm, or about 3 nm to about 10 nm.

When the size of the step between the first area R1 and the second area R2 is within a specific range, for example, less than or equal to 20 nm, less than or equal to 10 nm, less than or equal to 8 nm, less than or equal to 6 nm, less than or equal to 5 nm, or less than or equal to 3 nm, the amount of loss of the support layer 157 is relatively small during the removal of the remaining mask pattern 190 in the first area R1, which is advantageous for forming a capacitor having high capacitance. For example, when the size of the step between the first area R1 and the second area R2 is too large, it may be difficult to form a capacitor having higher capacitance.

As in the description of FIG. 9E, when the loading effect further gradually occurs between the first area R1 and the second area R2, and accordingly the upper surface of the mask pattern 190 changes with a further gentle inclination over a further long distance in the horizontal direction, the upper surface of the support layer 157 obtained due to the dry cleaning may have a step that gently changes. For example, after forming the recess patterns RS, the thickness of the mask pattern 190 in the first area R1 is greater than the thickness of the mask pattern 190 in the second area R2 and the thickness of the mask pattern 190 gradually changes therebetween, such a gradual change may be similarly transferred to the upper surface of the support layer 157. As a result, as illustrated in FIG. 8, the support layer 157 having an upper surface level that gradually changes over a certain horizontal length TZ may be obtained.

Figure 9I:
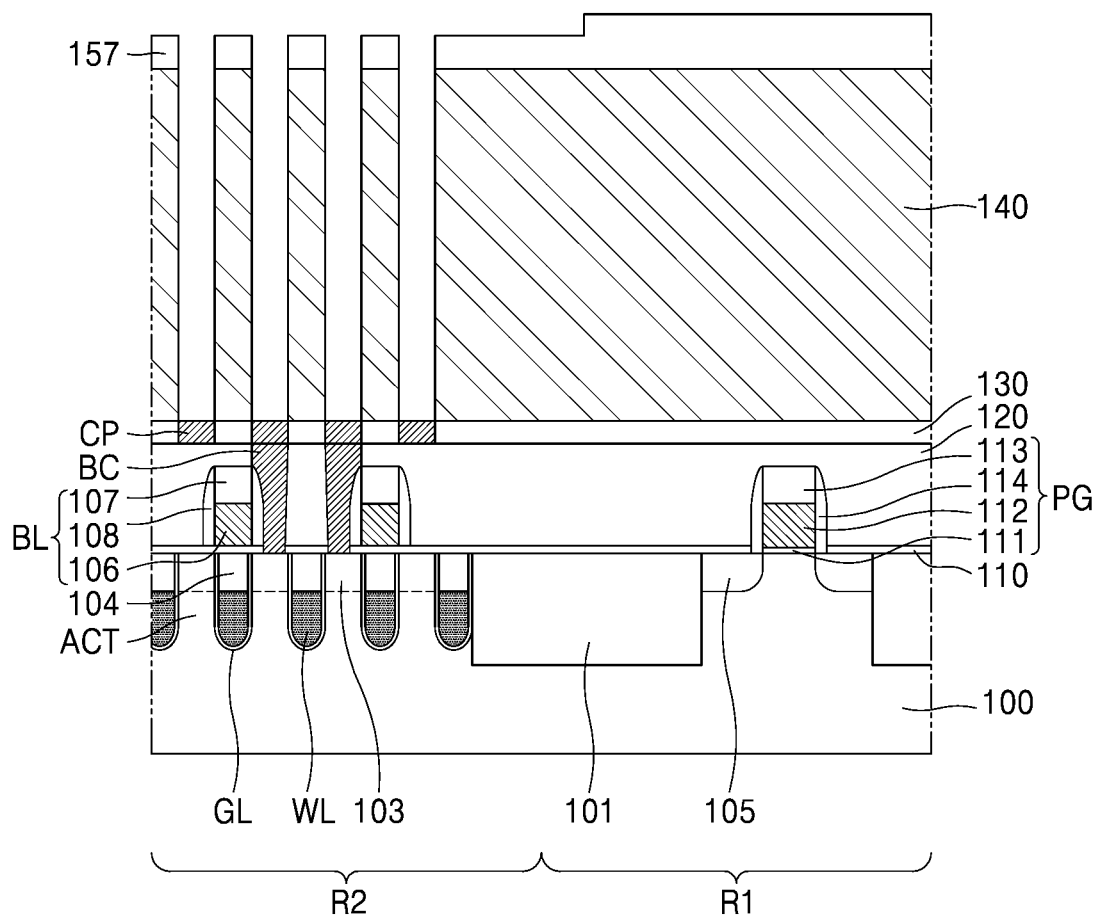

Referring to FIG. 9I, the protection film 170 may be removed by wet stripping.

The protection film 170 may be removed by using a wet etchant such as a sulfuric acid peroxide mixture (SPM), a hydrochloric peroxide mixture (HPM), an ammonium peroxide mixture (APM), or fluorine. The SPM may be a mixture of sulfuric acid and aqueous hydrogen peroxide solution. The HPM may be a mixture of hydrochloric acid and aqueous hydrogen peroxide solution. The APM may be a mixture of ammonium hydroxide and aqueous hydrogen peroxide solution. The fluorine may be diluted with deionized water and mixed with a surfactant. However, the present inventive concept is not limited thereto.

Figure 9J:
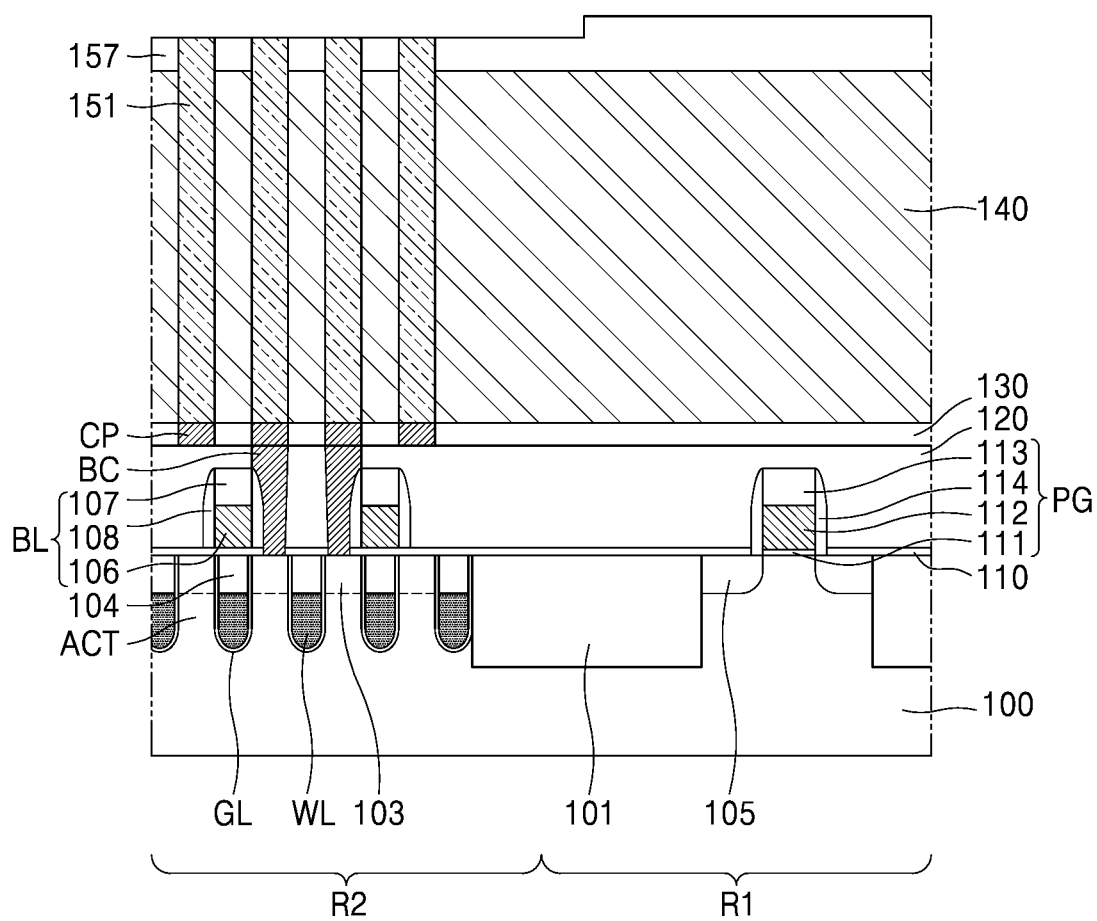

Referring to FIG. 9J, the lower electrodes 151 may be formed.

The lower electrodes 151, as a certain conductor, may completely fill the inside of the recess patterns RS. The lower electrodes 151 may include cobalt (Co), titanium (Ti), nickel (Ni), tungsten (W), molybdenum (Mo), platinum (Pt), ruthenium (Ru), iridium (Ir), titanium nitride (TiN), tantalum nitride (TaN), titanium aluminum nitride (TiAlN), tantalum aluminum nitride (TaAlN), titanium silicon nitride (TiSiN), tungsten nitride (WN), platinum oxide (PtO), ruthenium oxide (RuOx), iridium oxide (IrOx). SRO ($SrRuO_3$), BSRO (($Ba,Sr)RuO_3$), CRO ($CaRuO_3$), LSCO (($La,Sr)CoO_3$), or a combination thereof. However, the material of the lower electrodes 151 is not limited to the materials above.

The lower electrodes 151 may be formed by a method, for example, CVD, metal organic CVD (MOCVD), or atomic layer deposition (ALD). The material for forming the lower electrodes 151 may be formed on the upper surface of the support layer 157 between the recess patterns RS, which may be removed by using an etch back process or CMP. The material for forming lower electrodes 151 may be located only inside the recess patterns RS.

Figure 9K:
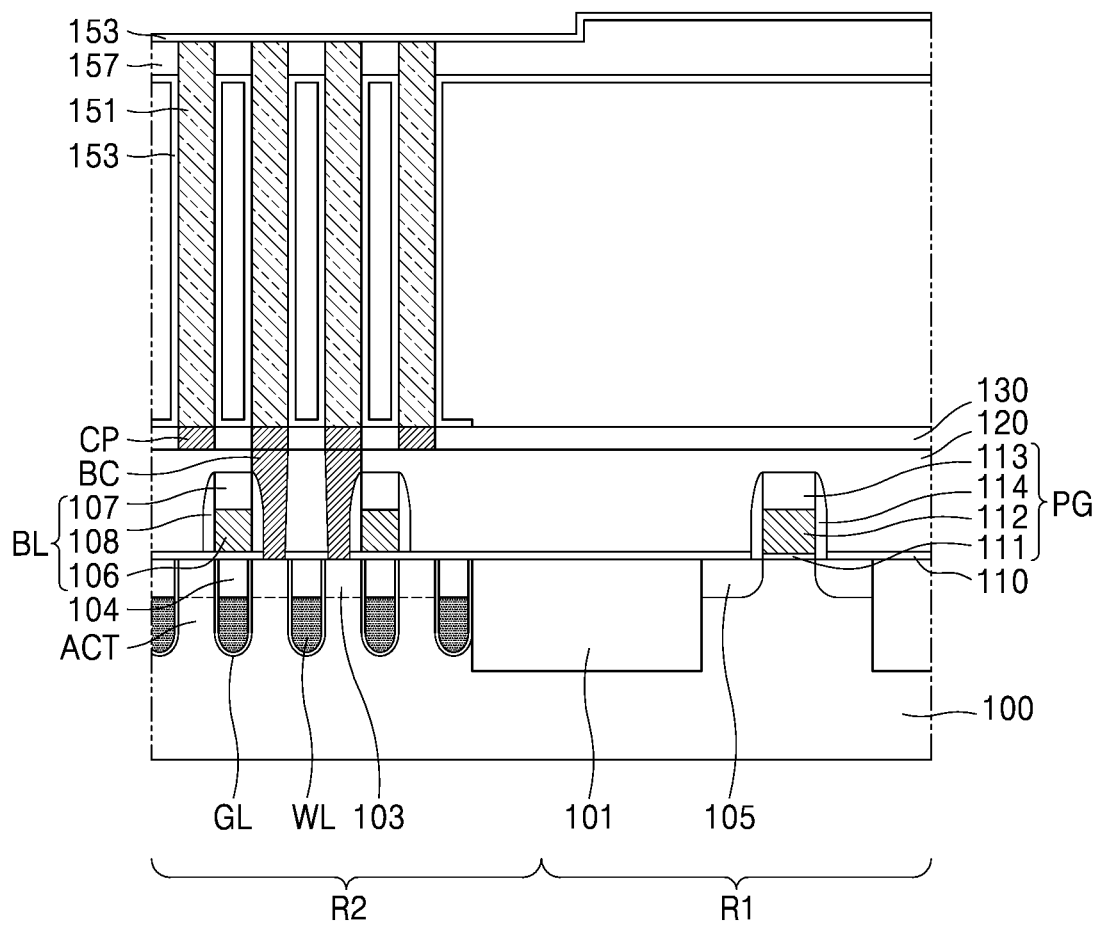

Referring to FIG. 9K, the mold layer 140 is removed, and the dielectric film 153 may be formed on the surfaces of the lower electrodes 151 and the support layer 157.

The mold layer 140 may be removed by a wet method through a plurality of holes formed in the support layer 157. For example, the mold layer 140 may be removed by a lift-off process using an etchant such as fluorine. After the mold layer 140 is removed, the lower electrodes 151 may be supported by the support layer 157.

The dielectric film 153 may be conformally formed on the surfaces of the lower electrodes 151 that are exposed as the mold layer 140 is removed. In this state, the dielectric film 153 may be formed on the exposed surface of the support layer 157. The dielectric film 153 may not be formed on portions of the surfaces of the lower electrodes 151 that are not in contact with the support layer 157.

The dielectric film 153 may include a nitride, an oxide, a metal oxide, or a combination thereof. For example, the dielectric film 153 may have a single membrane or multi-membrane structure including a silicon nitride, a silicon oxide, a metal oxide such as $HfO_2$, $ZrO_2$, $Al_2O_3$, $La_2O_3$, $Ta_2O_3$, and $TiO_2$, a dielectric material having a Perovskite structure such as STO (SrTiO$_3$), BST ((Ba,Sr)TiO$_3$), BaTiO, PZT, or PLZT, or a combination thereof. A detailed example of a multi-membrane structure may include a structure of a zirconium oxide film/an aluminum oxide film/a zirconium oxide film (ZAZ) or a zirconium oxide film/an aluminum oxide film/a tantalum oxide film (ZAT).

In some embodiments, the dielectric film 153 may have a thickness of about 5 nm to about 15 nm, but the embodiments are not limited thereto. The dielectric film 153 may be formed by CVD, physical vapor deposition (PVD), or an ALD process.

Figure 9L:
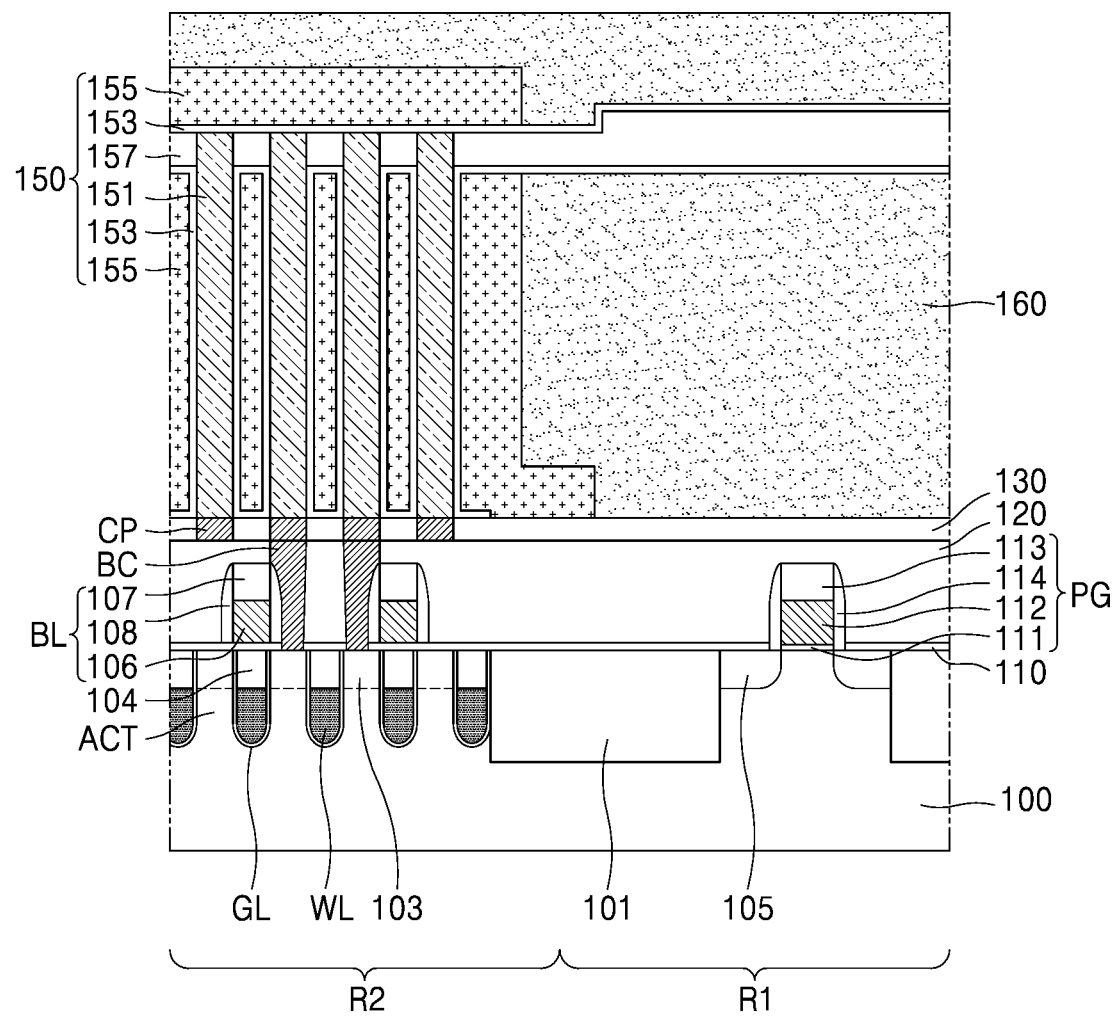

Referring to FIG. 9L, the upper electrode 155 may be formed on the dielectric film 153. For example, the upper electrode 155 may be formed above the lower electrodes 151 and between the lower electrodes 151. The upper electrode 155 may include Co, Ti, Ni, W, Mo, Pt, Ru, Ir, TiN, TaN, TiAlN, TaAlN, TiSiN, WN, PtO, RuOx, IrOx, SrRuO$_3$, (Ba,Sr)RuO$_3$, CaRuO$_3$, (La,Sr)CoO$_3$, or a combination thereof. However, the material for forming the upper electrode 155 is not limited to the materials above.

The upper electrode 155 may be formed by CVD, MOCVD, PVD, or an ALD process.

The lower electrode 151, the dielectric film 153, and the upper electrode 155 may constitute the capacitor 150.

The fourth interlayer insulating film 160, which is the same as the embedded insulating film 160 in FIG. 5, may be further formed on the upper electrode 155, as necessary.

The fourth interlayer insulating film 160 may include an HDP oxide film, TEOS, PE-TEOS. O3-TEOS, USG, PSG, BSG. BPSG, FSG, SOG, TOSZ, or a combination thereof. Alternatively, the fourth interlayer insulating film 160 may include a silicon nitride, a silicon oxynitride, or a low-k material having a low dielectric constant.

A memory device having superior capacitor performance may be provided by using the methods according to the above embodiments.

In the following description, the configuration and effect of the present inventive concept are described with detailed experimental examples and comparative examples. However, these experimental examples are merely for clearly understanding of the present inventive concept, but not limiting the scope of the present inventive concept.

Comparative Example

A capacitor was formed by a method according to the related art and capacitance was measured. A method of forming a capacitor, according to a comparative example, comprises:
(1) forming a mold layer and a support layer;
(2) forming a mask pattern;
(3) forming a recess pattern on the mold layer and the support layer;
(4) removing a mask pattern through dry etching;
(5) forming a lower electrode;
(6) removing the mold layer and forming a dielectric film; and
(7) forming an upper electrode.

Experimental Example

A capacitor was formed according to the embodiment of the present inventive concept and capacitance was measured. A method of forming a capacitor, according to the Experimental Example, was performed by sequentially conducting:
(1) forming a mold layer and a support layer
(2) forming a mask pattern;
(3) forming a recess pattern on the mold layer and the support layer;
(4) forming a protection film;
(5) partially removing the protection film by etch back to expose the mask pattern;
(6) removing the mask pattern through dry cleaning;
(7) removing the protection film;
(8) forming a lower electrode;
(9) removing the mold layer and forming a dielectric film; and
(10) forming an upper electrode.

Regarding the capacitors of the experimental example and the comparative example, the height, the loss of a support layer, the height variance of a capacitor according to the position in a wafer, and the support layer step height were measured and summarized in Table 1.

TABLE 1

|  | Comparative Example | Experimental Example |
| --- | --- | --- |
| Height of Capacitor | 1080 nm | 1150 nm |
| Loss of Support Layer | 80 nm | 10 nm |
| Capacitor Height Variance (in Wafer) | about 18 nm | about 10 nm |
| Support Layer Step Height | 30 nm or less | 5 nm or less |

As shown in Table 1, the capacitor according to the example embodiment may have a greater height and less loss of a support layer than the capacitor according to the comparative example. Also, it was found that the variance of the capacitor height decreases in the wafer and thus the stability and reliability of a process may be improved. Furthermore, it can be seen that the step height of a support layer is reduced much.

Figure 10:
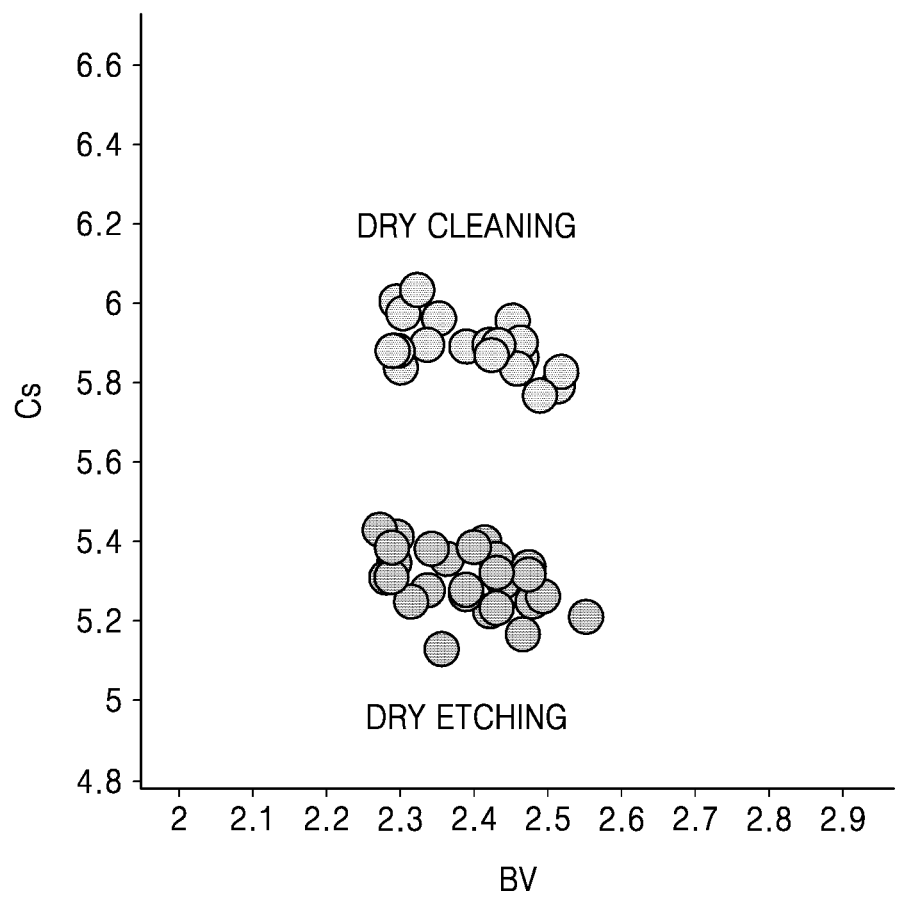
FIG. 10 is a graph showing a result of measurement of capacitance of capacitors in experimental examples and comparative examples.

FIG. 10 is a graph showing a result of measurement of capacitance Cs to breakdown voltage BV of the capacitors according to the experimental examples ("dry cleaning") and the comparative examples ("dry etching"). As a result of the statistical calculation of the capacitance Cs of individual capacitors, it can be seen that the capacitor according to the experimental example has an improvement of capacitance Cs of about 0.4 fF, compared to the capacitor according to the comparative example.

While the inventive concept has been particularly shown and described with reference to embodiments thereof, it will be understood that various changes in form and details may be made therein without departing from the spirit and scope of the following claims.

What is claimed is:

1. A method of forming a capacitor, the method comprising:
    forming a mold layer and a support material layer on a semiconductor substrate including a first area and a second area;
    forming a mask pattern for patterning the mold layer and the support material layer in the second area;
    forming a recess pattern in the second area by using the mask pattern;
    forming a protection film for lining a surface of the mask pattern and an inner surface of the recess pattern;
    removing a portion of the protection film to expose at least an upper surface of the mask pattern;

removing the mask pattern by a dry cleaning method;
removing a remaining portion of the protection film;
forming a lower electrode in the recess pattern;
removing the mold layer;
forming a dielectric film on a surface of the lower electrode; and
forming an upper electrode on the dielectric film,
wherein a pattern density of the mask pattern is higher in the second area than a pattern density of the mask pattern in the first area.

2. The method of claim 1, wherein the removing of the portion of the protection film is performed by etch back.

3. The method of claim 1, wherein the removing of the portion of the protection film is performed by chemical mechanical polishing (CMP).

4. The method of claim 1, wherein the removing of the remaining portion of the protection film is performed by wet etching.

5. The method of claim 1,
wherein the semiconductor substrate comprises at least one transistor, and
wherein the lower electrode is electrically connected to the at least one transistor.

6. The method of claim 1,
wherein the protection film is formed by atomic layer deposition (ALD), and
wherein the protection film has a thickness of about 0.7 nm to about 5 nm.

7. The method of claim 1, wherein the dry cleaning method comprises a plasma cleaning method in which a bias is not applied.

8. The method of claim 7, wherein the mask pattern comprises silicon (Si), and wherein the plasma cleaning method uses a plasma gas including a fluorine radical.

9. The method of claim 1, wherein, after forming the recess pattern, a remaining thickness of the mask pattern in the first area is greater than a remaining thickness of the mask pattern in the second area.

10. The method of claim 9, wherein, in the removing of the mask pattern by the dry cleaning method, removal of the mask pattern in the second area is completed earlier than removal of the mask pattern in the first area.

11. The method of claim 10, wherein, in the dry cleaning method, an etch selectivity of the support material layer to the mask pattern is at least 500:1.

12. The method of claim 10, wherein, after the removal of the mask pattern in the second area is completed, a portion of the support material layer in the second area is removed until the removal of the mask pattern in the first area is completed.

13. The method of claim 12, wherein, when the removal of the mask pattern in the first area is completed, a maximum of a level difference between an upper surface of the support material layer in the first area and an upper surface of the support material layer in the second area is within about 2 nm to about 20 nm.

14. A method of forming a semiconductor device, the method comprising:
forming a transistor in a second area of a semiconductor substrate including a first area and the second area, the transistor including a gate structure and an impurity area;
forming, on the semiconductor substrate, an interlayer insulating film covering the transistor and having a contact plug electrically connected to the impurity area;
forming a mold layer and a support material layer on the interlayer insulating film;
forming a mask pattern for patterning the mold layer and the support material layer in the second area;
forming a recess pattern in the second area by using the mask pattern;
forming a protection film for lining an inner surface of the recess pattern;
removing the mask pattern by a dry cleaning method after the forming of the protection film;
removing the protection film after the removing of the mask pattern;
forming a lower electrode in the recess pattern;
selectively removing the mold layer;
forming a dielectric film on a surface of the lower electrode; and
forming an upper electrode on the dielectric film,
wherein a pattern density of the mask pattern is higher in the second area than a pattern density of the mask pattern in the first area.

15. The method of claim 14, wherein the forming of the protection film comprises:
forming the protection film for lining a surface of the mask pattern and the inner surface of the recess pattern; and
removing a portion of the protection film to expose an upper surface of the mask pattern.

16. The method of claim 14, wherein, in the removing of the mask pattern, no bias is applied to employ the dry cleaning method.

17. The method of claim 16, wherein a plasma gas including a radical of species is used to employ the dry cleaning method.

18. The method of claim 17, wherein the plasma gas does not include ions of species.

19. A method of forming a fine pattern, the method comprising:
sequentially forming a first material film and a second material film on a semiconductor substrate including a first area and a second area;
forming a mask pattern having a first pattern density in the first area and a second pattern density in the second area, wherein the second pattern density is greater than the first pattern density;
forming a recess pattern in the second area of the semiconductor substrate by using the mask pattern;
forming a protection film for lining an inner surface of the recess pattern;
removing the mask pattern by a dry cleaning method after the forming of the protection film;
removing the protection film after the removing of the mask pattern; and
forming a conductor in the recess pattern.

* * * * *